US011152397B2

(12) United States Patent
Yamazaki et al.

(10) Patent No.: US 11,152,397 B2
(45) Date of Patent: Oct. 19, 2021

(54) DISPLAY DEVICE

(71) Applicant: Semiconductor Energy Laboratory Co., Ltd., Atsugi (JP)

(72) Inventors: Shunpei Yamazaki, Setagaya (JP); Kengo Akimoto, Atsugi (JP); Shigeki Komori, Isehara (JP); Hideki Uochi, Atsugi (JP); Tomoya Futamura, Atsugi (JP); Takahiro Kasahara, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 9 days.

(21) Appl. No.: 16/690,804

(22) Filed: Nov. 21, 2019

(65) Prior Publication Data
US 2020/0091202 A1 Mar. 19, 2020

Related U.S. Application Data

(60) Division of application No. 14/700,562, filed on Apr. 30, 2015, now Pat. No. 10,559,598, which is a
(Continued)

(30) Foreign Application Priority Data

Sep. 19, 2008 (JP) ................................. 2008-241645

(51) Int. Cl.
*H01L 27/12* (2006.01)
*H01L 27/32* (2006.01)
(Continued)

(52) U.S. Cl.
CPC .... *H01L 27/1225* (2013.01); *G02F 1/136204* (2013.01); *G02F 1/136286* (2013.01);
(Continued)

(58) Field of Classification Search
CPC ......... G02F 1/136204; H01L 29/41733; H01L 29/458; H01L 29/66765; H01L 27/0266–0285
See application file for complete search history.

(56) References Cited

U.S. PATENT DOCUMENTS 3,819,952 A 6/1974 Enomoto et al.
5,684,555 A 11/1997 Shiba et al.
(Continued)

FOREIGN PATENT DOCUMENTS

CN 001488083 A 4/2004
CN 001539093 A 10/2004
(Continued)

OTHER PUBLICATIONS

Jeong et al "12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4 (Year: 2008).*
(Continued)

*Primary Examiner* — John A Bodnar
(74) *Attorney, Agent, or Firm* — Robinson IP Law Office, P.C.; Eric J. Robinson

(57) ABSTRACT

A protective circuit includes a non-linear element which includes a gate electrode, a gate insulating layer covering the gate electrode, a first oxide semiconductor layer overlapping with the gate electrode over the gate insulating layer, and a first wiring layer and a second wiring layer whose end portions overlap with the gate electrode over the first oxide semiconductor layer and in which a conductive layer and a second oxide semiconductor layer are stacked. Over the gate insulating layer, oxide semiconductor layers with different properties are bonded to each other, whereby stable operation can be performed as compared with Schottky junction.

(Continued)

Thus, the junction leakage can be reduced and the characteristics of the non-linear element can be improved.

6 Claims, 27 Drawing Sheets

Related U.S. Application Data continuation of application No. 12/556,704, filed on Sep. 10, 2009, now Pat. No. 9,196,633.

(51) Int. Cl.
*G02F 1/1362* (2006.01)
*H01L 27/02* (2006.01)
*H01L 29/786* (2006.01)

(52) U.S. Cl.
CPC ........ *H01L 27/0266* (2013.01); *H01L 27/124* (2013.01); *H01L 27/3262* (2013.01); *H01L 27/3276* (2013.01); *H01L 29/7869* (2013.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,747,930 A | 5/1998 | Utsugi | |
| 5,847,410 A | 12/1998 | Nakajima | |
| 5,909,035 A | 6/1999 | Kim | |
| 6,043,971 A | 3/2000 | Song et al. | |
| 6,294,274 B1 | 9/2001 | Kawazoe et al. | |
| 6,356,331 B1 | 3/2002 | Ono et al. | |
| 6,563,174 B2 | 5/2003 | Kawasaki et al. | |
| 6,586,346 B1 | 7/2003 | Yamazaki et al. | |
| 6,632,696 B2 | 10/2003 | Kimura et al. | |
| 6,696,701 B2 | 2/2004 | Hector et al. | |
| 6,727,522 B1 | 4/2004 | Kawasaki et al. | |
| 6,740,596 B2 | 5/2004 | Hayase et al. | |
| 6,788,355 B1 | 9/2004 | Ihida et al. | |
| 6,791,632 B2 | 9/2004 | Lee et al. | |
| 6,890,783 B2 | 5/2005 | Kimura et al. | |
| 6,911,688 B2 | 6/2005 | Yamazaki et al. | |
| 6,914,643 B1 | 7/2005 | Nagase et al. | |
| 6,960,812 B2 | 11/2005 | Yamazaki et al. | |
| 6,987,311 B2 | 1/2006 | Yang et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,125,654 B2 | 10/2006 | Hirota | |
| 7,148,510 B2 | 12/2006 | Yamazaki et al. | |
| 7,209,192 B2 | 4/2007 | Lee et al. | |
| 7,211,825 B2 | 5/2007 | Shih et al. | |
| 7,259,429 B2 | 8/2007 | Yamazaki | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,304,351 B2 | 12/2007 | Liu et al. | |
| 7,321,414 B2 | 1/2008 | Sekiguchi et al. | |
| 7,323,356 B2 | 1/2008 | Hosono et al. | |
| 7,342,617 B2 | 3/2008 | Tanaka et al. | |
| 7,375,376 B2 | 5/2008 | Yamazaki et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,423,723 B2 | 9/2008 | Hirota | |
| 7,439,545 B2 | 10/2008 | Honda | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,569,885 B2 | 8/2009 | Hirabayashi et al. | |
| 7,573,067 B2 | 8/2009 | Yamazaki | |
| 7,674,650 B2 | 3/2010 | Akimoto et al. | |
| 7,724,314 B2 | 5/2010 | Tanaka et al. | |
| 7,732,819 B2 | 6/2010 | Akimoto et al. | |
| 7,749,688 B2 | 7/2010 | Hirota | |
| 7,864,254 B2 | 1/2011 | Kim et al. | |
| 7,868,953 B2 | 1/2011 | Lee et al. | |
| 7,907,224 B2 | 3/2011 | Ito et al. | |
| 7,910,490 B2 | 3/2011 | Akimoto et al. | |
| 7,910,920 B2 | 3/2011 | Park et al. | |
| 7,932,521 B2 | 4/2011 | Akimoto et al. | |
| 7,964,871 B2 | 6/2011 | Iwasaki | |
| 7,964,874 B2 | 6/2011 | Yamazaki et al. | |
| 7,982,215 B2 | 7/2011 | Inoue et al. | |
| 7,982,220 B2 | 7/2011 | Sakakura et al. | |
| 7,986,382 B2 | 7/2011 | Kim et al. | |
| 7,989,815 B2 | 8/2011 | Yamazaki et al. | |
| 7,990,484 B2 | 8/2011 | Lee et al. | |
| 8,013,331 B2 | 9/2011 | Wakita | |
| 8,030,195 B2 | 10/2011 | Inoue et al. | |
| 8,040,446 B2 | 10/2011 | Lee et al. | |
| 8,044,949 B2 | 10/2011 | Yamazaki | |
| 8,093,589 B2 | 1/2012 | Sugihara et al. | |
| 8,115,210 B2 | 2/2012 | Yamazaki et al. | |
| 8,134,156 B2 | 3/2012 | Akimoto | |
| 8,148,721 B2 | 4/2012 | Hayashi et al. | |
| 8,164,718 B2 | 4/2012 | Fujikawa et al. | |
| 8,168,544 B2 | 5/2012 | Chang | |
| 8,174,635 B2 | 5/2012 | Kim et al. | |
| 8,274,077 B2 | 9/2012 | Akimoto et al. | |
| 8,319,219 B2 | 11/2012 | Yamazaki | |
| 8,334,959 B2 | 12/2012 | Hirabayashi et al. | |
| 8,373,166 B2 | 2/2013 | Yamazaki | |
| 8,400,590 B2 | 3/2013 | Fujikawa et al. | |
| 8,466,463 B2 | 6/2013 | Akimoto et al. | |
| 8,471,258 B2 | 6/2013 | Sakakura et al. | |
| 8,614,442 B2 | 12/2013 | Park et al. | |
| 8,629,069 B2 | 1/2014 | Akimoto et al. | |
| 8,643,021 B2 | 2/2014 | Yamazaki et al. | |
| 8,669,550 B2 | 3/2014 | Akimoto et al. | |
| 8,716,711 B2 | 5/2014 | Iwasaki | |
| 8,735,896 B2 | 5/2014 | Yamazaki | |
| 8,790,959 B2 | 7/2014 | Akimoto et al. | |
| 8,796,069 B2 | 8/2014 | Akimoto et al. | |
| 9,201,309 B2 | 12/2015 | Hirota | |
| 2001/0020988 A1 | 9/2001 | Ohgiichi et al. | |
| 2001/0046027 A1 | 11/2001 | Tai et al. | |
| 2002/0009890 A1 | 1/2002 | Hayase et al. | |
| 2002/0056838 A1 | 5/2002 | Ogawa | |
| 2002/0075421 A1 | 6/2002 | Wu | |
| 2002/0132454 A1 | 9/2002 | Ohtsu et al. | |
| 2003/0030054 A1 | 2/2003 | Hector et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0061671 A1 | 4/2004 | Kawasaki et al. | |
| 2004/0127038 A1 | 7/2004 | Carcia et al. | |
| 2005/0017247 A1 | 1/2005 | Koo et al. | |
| 2005/0017274 A1 | 1/2005 | Watanabe et al. | |
| 2005/0017302 A1 | 1/2005 | Hoffman | |
| 2005/0087741 A1 | 4/2005 | Yamazaki | |
| 2005/0140836 A1* | 6/2005 | Choi ................. G02F 1/136204 349/40 |
| 2005/0199959 A1 | 9/2005 | Chiang et al. | |
| 2005/0270434 A1 | 12/2005 | Jung et al. | |
| 2005/0270454 A1 | 12/2005 | Ahn et al. | |
| 2005/0275038 A1 | 12/2005 | Shih et al. | |
| 2006/0012729 A1 | 1/2006 | Tanaka et al. | |
| 2006/0035452 A1 | 2/2006 | Carcia et al. | |
| 2006/0043377 A1 | 3/2006 | Hoffman et al. | |
| 2006/0086933 A1 | 4/2006 | Iechi et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119778 A1 | 6/2006 | Oda et al. | |

(56) References Cited

U.S. PATENT DOCUMENTS

| | | |
|---|---|---|
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0286737 A1 | 12/2006 | Levy et al. |
| 2006/0292777 A1 | 12/2006 | Dunbar |
| 2007/0004202 A1 | 1/2007 | Fujii |
| 2007/0024187 A1 | 2/2007 | Shin et al. |
| 2007/0026580 A1 | 2/2007 | Fujii |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0176178 A1 | 8/2007 | Lee et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0205976 A1 | 9/2007 | Takatori et al. |
| 2007/0246778 A1 | 10/2007 | Liou et al. |
| 2007/0252928 A1 | 11/2007 | Ito et al. |
| 2007/0272922 A1 | 11/2007 | Kim et al. |
| 2007/0278488 A1 | 12/2007 | Hirabayashi et al. |
| 2007/0287296 A1 | 12/2007 | Chang |
| 2008/0006877 A1 | 1/2008 | Mardilovich et al. |
| 2008/0024091 A1 | 1/2008 | Yamazaki et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062112 A1 | 3/2008 | Umezaki |
| 2008/0070383 A1 | 3/2008 | Herman et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0135846 A1 | 6/2008 | Shin et al. |
| 2008/0136986 A1 | 6/2008 | Kim et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0218652 A1 | 9/2008 | Kim et al. |
| 2008/0224133 A1 | 9/2008 | Park et al. |
| 2008/0232047 A1* | 9/2008 | Yamada ............... G02F 1/13452 361/679.02 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0297756 A1 | 12/2008 | Hirota |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0316406 A1 | 12/2008 | Inoue et al. |
| 2009/0002623 A1 | 1/2009 | Oda et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141202 A1 | 6/2009 | Yoshida |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025678 A1 | 2/2010 | Yamazaki et al. |
| 2010/0051949 A1 | 3/2010 | Yamazaki et al. |
| 2010/0065838 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065842 A1 | 3/2010 | Yamazaki et al. |
| 2010/0065844 A1 | 3/2010 | Tokunaga |
| 2010/0072470 A1 | 3/2010 | Yamazaki et al. |
| 2010/0084652 A1 | 4/2010 | Yamazaki et al. |
| 2010/0084654 A1 | 4/2010 | Yamazaki et al. |
| 2010/0092800 A1 | 4/2010 | Itagaki et al. |
| 2010/0109002 A1 | 5/2010 | Itagaki et al. |
| 2010/0127253 A1 | 5/2010 | Inoue et al. |
| 2010/0195011 A1 | 8/2010 | Tanaka et al. |
| 2011/0104851 A1 | 5/2011 | Akimoto et al. |
| 2011/0121290 A1 | 5/2011 | Akimoto et al. |
| 2011/0175090 A1 | 7/2011 | Sugihara et al. |
| 2011/0260159 A1 | 10/2011 | Yamazaki et al. |
| 2012/0068915 A1 | 3/2012 | Yamazaki |
| 2012/0132908 A1 | 5/2012 | Sugihara et al. |
| 2013/0294003 A1 | 11/2013 | Tanaka et al. |

FOREIGN PATENT DOCUMENTS

| | | |
|---|---|---|
| CN | 001577435 A | 2/2005 |
| CN | 001617351 A | 5/2005 |
| CN | 001790143 A | 6/2006 |
| CN | 001941299 A | 4/2007 |
| CN | 101201514 A | 6/2008 |
| CN | 101211082 A | 7/2008 |
| EP | 0684753 A | 11/1995 |
| EP | 1087255 A | 3/2001 |
| EP | 1378788 A | 1/2004 |
| EP | 1662300 A | 5/2006 |
| EP | 1737044 A | 12/2006 |
| EP | 1764839 A | 3/2007 |
| EP | 1770788 A | 4/2007 |
| EP | 1933293 A | 6/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2372443 A | 10/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-049652 A | 2/1992 |
| JP | 05-216068 A | 8/1993 |
| JP | 05-251705 A | 9/1993 |
| JP | 05-257168 A | 10/1993 |
| JP | 08-179262 A | 7/1996 |
| JP | 08-264794 A | 10/1996 |
| JP | 09-230383 A | 9/1997 |
| JP | 09-281525 A | 10/1997 |
| JP | 09-297321 A | 11/1997 |
| JP | 10-303431 A | 11/1998 |
| JP | 11-017023 A | 1/1999 |
| JP | 11-505377 | 5/1999 |
| JP | 2000-044236 A | 2/2000 |
| JP | 2000-150900 A | 5/2000 |
| JP | 2001-125134 A | 5/2001 |
| JP | 2001-142096 A | 5/2001 |
| JP | 2001-250958 A | 9/2001 |
| JP | 2002-026333 A | 1/2002 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-069028 A | 3/2003 |
| JP | 2003-086000 A | 3/2003 |
| JP | 2003-086808 A | 3/2003 |
| JP | 2003-107528 A | 4/2003 |
| JP | 2003-308027 A | 10/2003 |
| JP | 2004-038130 A | 2/2004 |
| JP | 2004-103957 A | 4/2004 |
| JP | 2004-118132 A | 4/2004 |
| JP | 2004-273614 A | 9/2004 |
| JP | 2004-273732 A | 9/2004 |
| JP | 2004-361571 A | 12/2004 |
| JP | 2004-538512 A | 12/2004 |
| JP | 2005-302808 A | 10/2005 |
| JP | 2006-030627 A | 2/2006 |
| JP | 2006-186319 A | 7/2006 |
| JP | 2006-337986 A | 12/2006 |
| JP | 2007-042775 A | 2/2007 |
| JP | 2007-065615 A | 3/2007 |
| JP | 2007-073703 A | 3/2007 |
| JP | 2007-081362 A | 3/2007 |
| JP | 2007-096055 A | 4/2007 |
| JP | 2007-123861 A | 5/2007 |
| JP | 2007-150158 A | 6/2007 |
| JP | 2007-165861 A | 6/2007 |
| JP | 2007-194596 A | 8/2007 |
| JP | 2007-298627 A | 11/2007 |
| JP | 2007-322761 A | 12/2007 |
| JP | 2007-324375 A | 12/2007 |
| JP | 2008-034829 A | 2/2008 |
| JP | 2008-205469 A | 9/2008 |
| TW | 575766 | 2/2004 |
| TW | I228199 | 2/2005 |
| TW | I243480 | 11/2005 |
| TW | 200730985 | 8/2007 |
| TW | 200818319 | 4/2008 |
| WO | WO-2003/014809 | 2/2003 |
| WO | WO-2003/036374 | 5/2003 |
| WO | WO-2003/087924 | 10/2003 |
| WO | WO-2004/114391 | 12/2004 |
| WO | WO-2006/051994 | 5/2006 |
| WO | WO-2007/040194 | 4/2007 |
| WO | WO-2007/058329 | 5/2007 |
| WO | WO-2007/148601 | 12/2007 |
| WO | WO-2008/015944 | 2/2008 |

OTHER PUBLICATIONS

Chinese Office Action (Application No. 201310335796.1) dated Apr. 23, 2015.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

International Search Report (Application No. PCT/JP2009/065371) dated Oct. 27, 2009.

Written Opinion (Application No. PCT/JP2009/065371) dated Oct. 27, 2009.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-251, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys, (Journal. of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Chinese Office Action (Application No. 200980137189.6) dated Jan. 16, 2013.
International Search Report (Application No. PCT/JP2009/065542) dated Oct. 27, 2009.
Written Opinion (Application No. PCT/JP2009/065542) dated Oct. 27, 2009.
Korean Office Action (Application No. 2011-7008839) dated Nov. 4, 2013.
Taiwanese Office Action (Application No. 98131225) dated May 6, 2014.
Taiwanese Office Action (Application No. 101126261) dated May 6, 2014.
Chinese Office Action (Application No. 201210292427.4) dated Aug. 28, 2014.
Chinese Office Action (Application No. 201210292427.4) dated May 21, 2015.
Taiwanese Office Action (Application No. 104100539) dated Dec. 28, 2015.
Taiwanese Office Action (Application No. 105135727) dated Sep. 27, 2017.
Taiwanese Office Action (Application No. 107128124) dated Feb. 24, 2021.

* cited by examiner

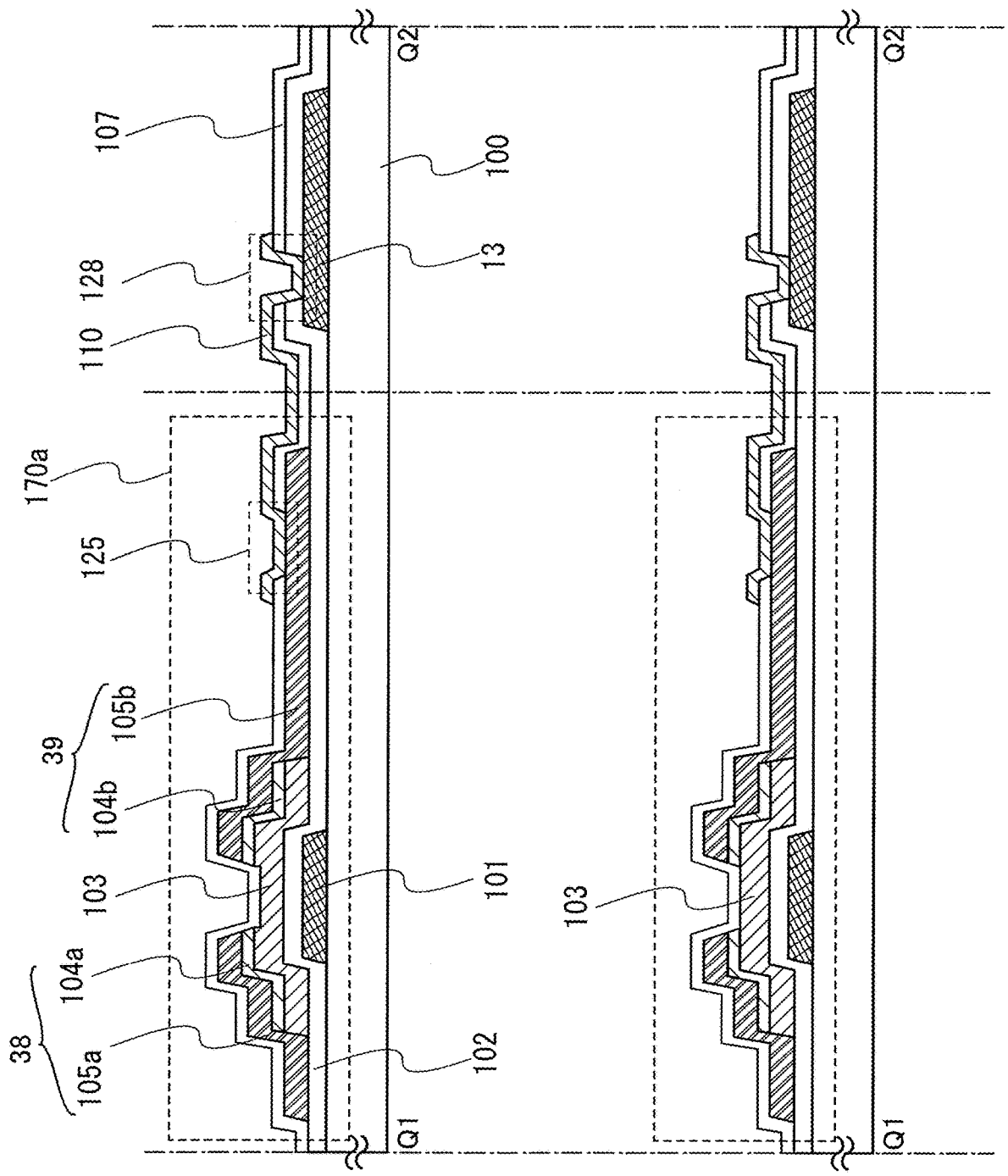

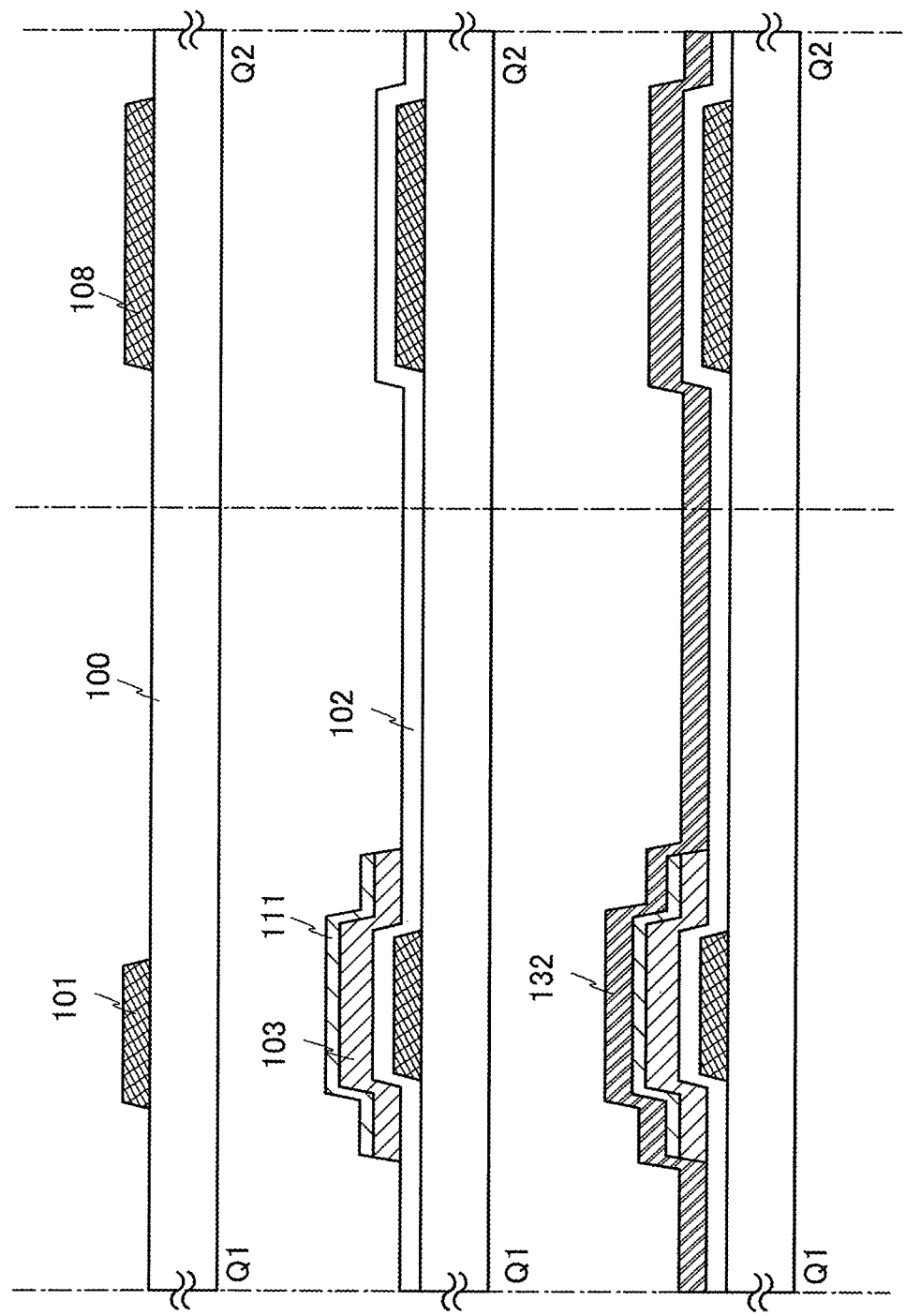

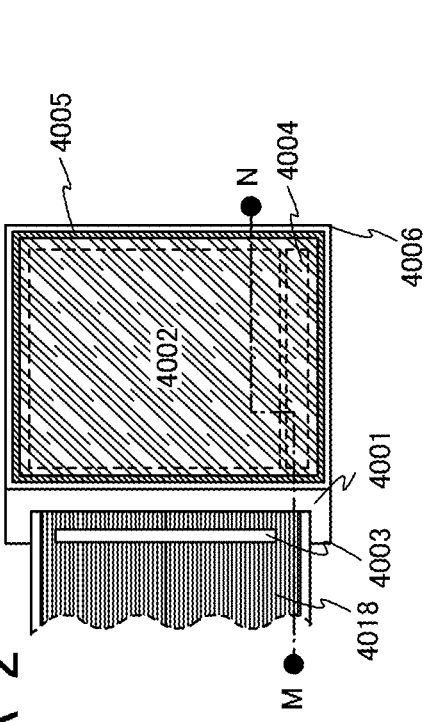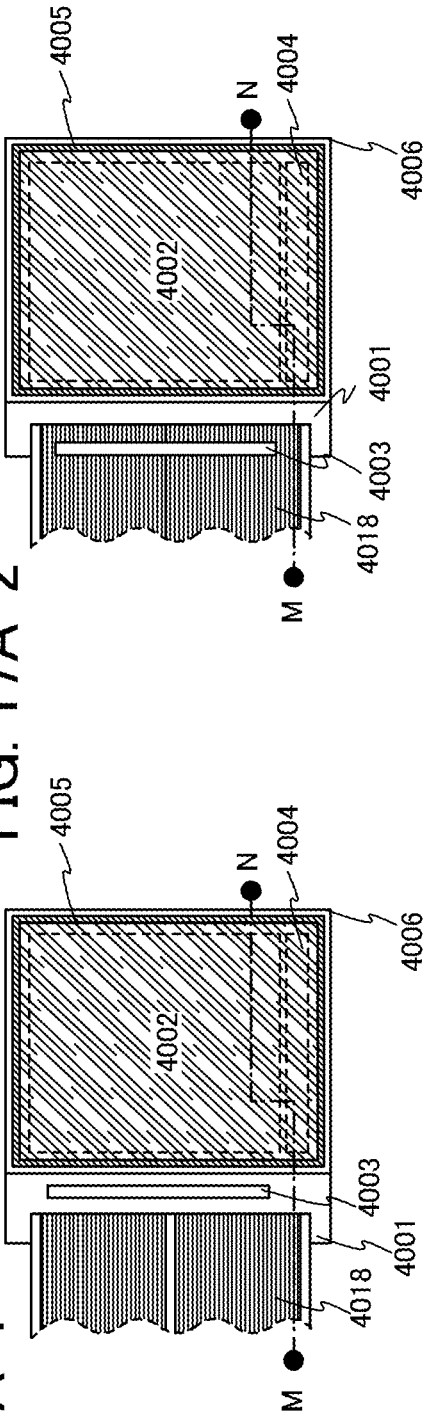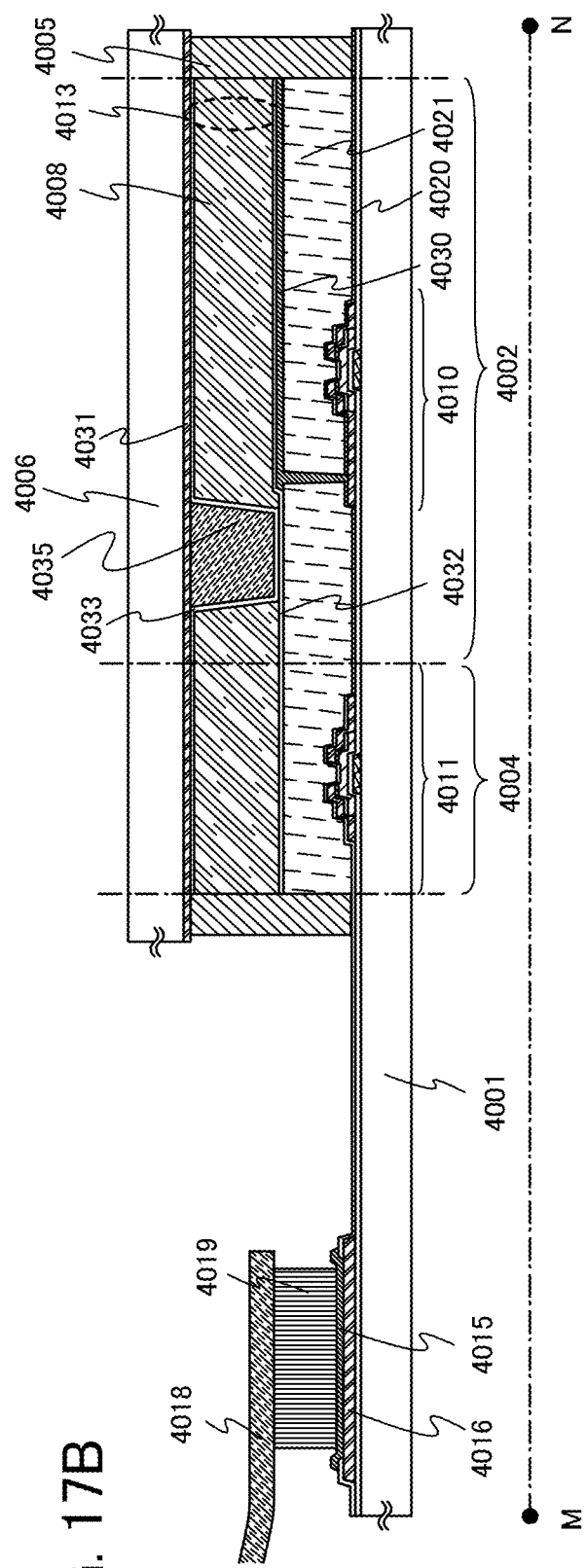

DISPLAY DEVICE

TECHNICAL FIELD

The present invention relates to a display device including an oxide semiconductor.

BACKGROUND ART

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility, but such a transistor can be formed over a glass substrate with a larger area. On the other hand, a thin film transistor manufactured using a crystalline silicon has high field effect mobility, but a crystallization step such as laser annealing is necessary and such a transistor is not always suitable for a larger glass substrate.

In view of the foregoing, attention has been drawn to a technique by which a thin film transistor is manufactured using an oxide semiconductor, and such a transistor is applied to an electronic device or an optical device. For example, Patent Document 1 and Patent Document 2 disclose a technique by which a thin film transistor is manufactured using zinc oxide (ZnO) or an In—Ga—Zn—O based oxide semiconductor as an oxide semiconductor film and such a transistor is used as a switching element or the like of an image display device.

[Patent Document 1] Japanese Published Paten Application No. 2007-123861

[Patent Document 2] Japanese Published Paten Application No. 2007-96055

DISCLOSURE OF THE INVENTION

A thin film transistor in which a channel formation region is formed using an oxide semiconductor has characteristics as follows: the operation speed is higher than that of a thin film transistor including amorphous silicon and the manufacturing process is simpler than that of a thin film transistor including polycrystalline silicon. That is, the use of an oxide semiconductor makes it possible to manufacture a thin film transistor with high field effect mobility even at low temperatures of 300° C. or lower.

In order to take advantage of such features of a display device including an oxide semiconductor, which is superior in operating characteristics and capable of manufacture at low temperatures, a protective circuit and the like including suitable structures are necessary. Moreover, it is important to ensure the reliability of the display device including an oxide semiconductor.

An object of one embodiment of the present invention is to provide a structure which is suitable for a protective circuit.

In a display device intended for a variety of purposes manufactured by stacking, in addition to an oxide semiconductor, an insulating film and a conductive film, an object of one embodiment of the present invention is to enhance the function of a protective circuit and stabilize the operation.

One embodiment of the present invention is a display device in which a protective circuit is formed using a non-linear element including an oxide semiconductor. This non-linear element includes a combination of oxide semiconductors with different oxygen contents.

One illustrative embodiment of the present invention is a display device which includes scan lines and signal lines provided over a substrate having an insulating surface so as to intersect with each other, a pixel portion in which pixel electrodes are arranged in matrix, and a non-linear element formed from an oxide semiconductor in a region outside the pixel portion. The pixel portion includes a thin film transistor in which a channel formation region is formed in a first oxide semiconductor layer. The thin film transistor in the pixel portion includes a gate electrode connected to the scan line, a first wiring layer which is connected to the signal line and which is in contact with the first oxide semiconductor layer, and a second wiring layer which is connected to the pixel electrode and which is in contact with the first oxide semiconductor layer. Moreover, the non-linear element is provided between the pixel portion and a signal input terminal disposed at the periphery of the substrate. The non-linear element includes the gate electrode, a gate insulating layer covering the gate electrode, the first oxide semiconductor layer overlapping with the gate electrode over the gate insulating layer, and a pair of the first wiring layer and the second wiring layer whose end portions overlap with the gate electrode over the first oxide semiconductor layer and in which a conductive layer and a second oxide semiconductor layer are stacked. The gate electrode of the non-linear element is connected to the scan line or the signal line and the first wiring layer or the second wiring layer of the non-linear element is connected to the gate electrode via a third wiring layer so that the potential of the gate electrode is applied to the first wiring layer or the second wiring layer.

One illustrative embodiment of the present invention is a display device which includes scan lines and signal lines provided over a substrate having an insulating surface so as to intersect with each other, a pixel portion including pixel electrodes arranged in matrix, and a protective circuit in a region outside the pixel portion. The pixel portion includes a thin film transistor in which a channel formation region is formed in a first oxide semiconductor. The thin film transistor in the pixel portion includes a gate electrode connected to the scan line, a first wiring layer which is connected to the signal line and which is in contact with the first oxide semiconductor layer, and a second wiring layer which is connected to the pixel electrode and which is in contact with the first oxide semiconductor layer. In the region outside the pixel portion, a protective circuit for connecting the scan line and a common wiring to each other and a protective circuit for connecting the signal line and a common wiring to each other are provided. The protective circuit includes a non-linear element which includes the gate electrode, a gate insulating layer covering the gate electrode, the first oxide semiconductor layer overlapping with the gate electrode over the gate insulating layer, and a pair of a first wiring layer and a second wiring layer whose end portions overlap with the gate electrode over the first oxide semiconductor layer and in which a conductive layer and a second oxide semiconductor layer are stacked. Moreover, the first wiring layer or the second wiring layer of the non-linear element is connected to the gate electrode via a third wiring layer.

Here, the first oxide semiconductor layer includes oxygen at higher concentration than the second oxide semiconductor layer. That is, the first oxide semiconductor layer is oxygen-excess type, while the second oxide semiconductor layer is oxygen-deficiency type. The first oxide semiconductor layer has lower electrical conductivity than the second oxide semiconductor layer. The first oxide semiconductor layer and the second oxide semiconductor layer have non-single-crystal structures, and include at least an amorphous component. In addition, the second oxide semiconductor layer includes a nanocrystal in an amorphous structure in some cases.

Note that the ordinal numbers such as "first" and "second" in this specification are used for convenience and do not denote the order of steps and the stacking order of layers. In addition, the ordinal numbers in this specification do not denote particular names which specify the invention.

According to one embodiment of the present invention, a display device having a structure suitable for a protective circuit can be provided by forming the protective circuit with use of a non-linear element including an oxide semiconductor. In the connection structure between the first oxide semiconductor layer of the non-linear element and the wiring layers, the provision of the region which is bonded with the second oxide semiconductor layer, which has higher electrical conductivity than the first oxide semiconductor layer, allows stable operation as compared with a case of using only metal wirings. Accordingly, the function of the protective circuit is enhanced and the operation can be made stable.

BRIEF DESCRIPTION OF DRAWINGS

In the accompanying drawings:

FIGS. 5A and 5B are cross-sectional views illustrating an example of a protective circuit;

FIGS. 8A to 8C are cross-sectional views illustrating a process for manufacturing a protective circuit;

FIGS. 17A-1 and 17A-2 are top views and FIG. 17B is a cross-sectional view, which illustrate a semiconductor device of Embodiment 6;

BEST MODE FOR CARRYING OUT THE INVENTION

Figure 1:
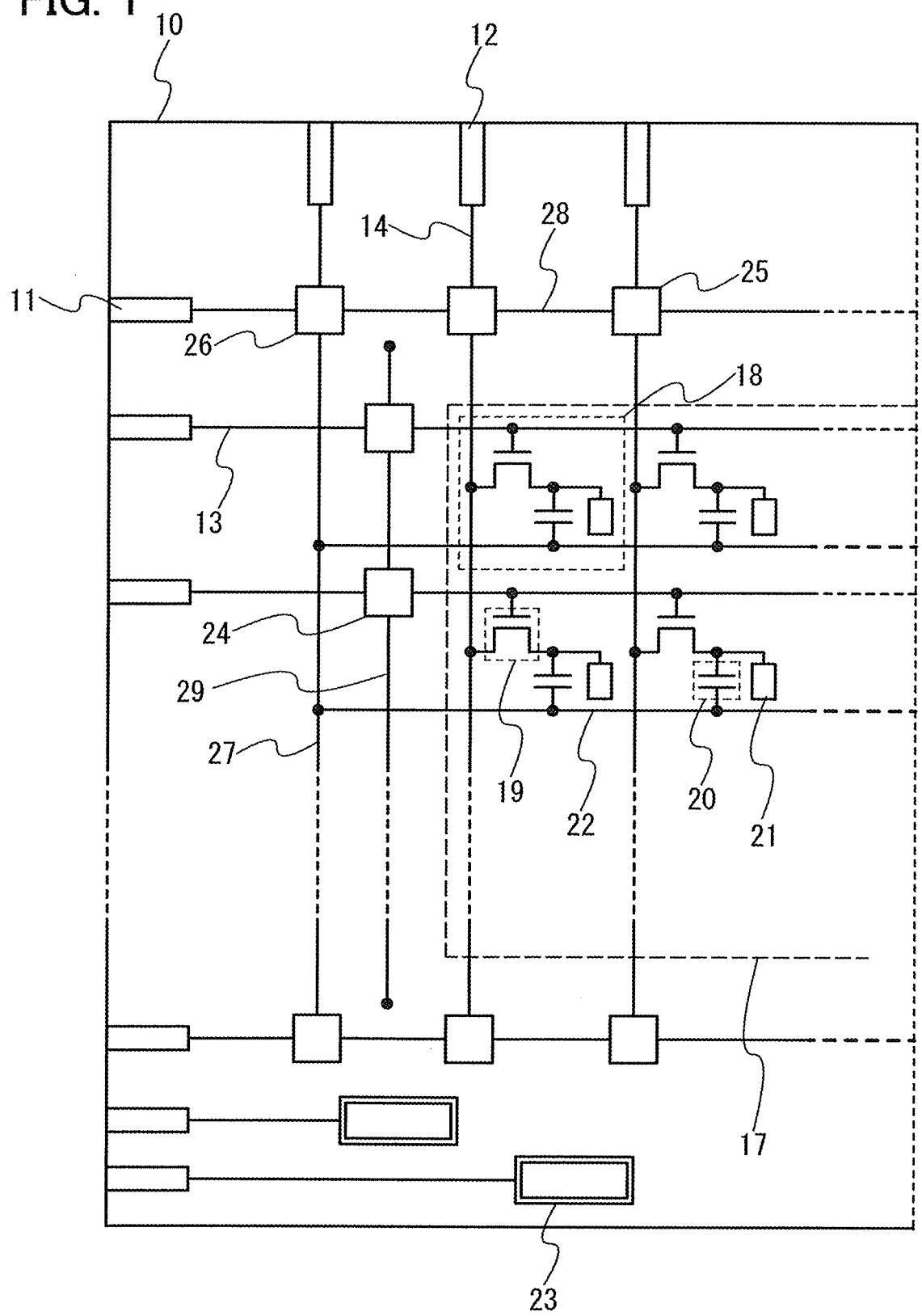
FIG. 1 illustrates a positional relationship between a pixel portion and protective circuits including signal input terminals, scan lines, signal lines, and non-linear elements in a display device.

Hereinafter, embodiments of the present invention are described below with reference to the drawings. The present invention is not limited to the description below and it is easily understood by those skilled in the art that the mode and details can be changed variously without departing from the scope and spirit of the present invention. Therefore, the present invention should not be interpreted as being limited to description in the embodiments below. Note that a reference numeral denoting the same portion in all figures is used in common in the structures of the present invention which is explained below.

Embodiment 1

In Embodiment 1, an example of a display device including a pixel portion and a protective circuit including a non-linear element provided around the pixel portion is described with reference to drawings.

FIG. 1 illustrates a positional relationship between a pixel portion and protective circuits including signal input terminals, scan lines, signal lines, and non-linear elements in a display device. Over a substrate 10 having an insulating surface, scan lines 13 and signal lines 14 intersect with each other to form a pixel portion 17.

The pixel portion 17 includes a plurality of pixels 18 arranged in matrix. The pixel 18 includes a pixel transistor 19 connected to the scan line 13 and the signal line 14, a storage capacitor portion 20, and a pixel electrode 21.

In the pixel structure illustrated here, one electrode of the storage capacitor portion 20 is connected to the pixel transistor 19 and the other electrode is connected to a capacitor line 22. Moreover, the pixel electrode 21 forms one electrode which drives a display element (such as a liquid crystal element, a light-emitting element, or a contrast medium (electronic ink)). The other electrode of such a display element is connected to a common terminal 23.

A protective circuit is provided between the pixel portion 17, and a terminal 11 and a terminal 12. In Embodiment 1, a plurality of protective circuits are provided. Therefore, even though surge voltage due to static electricity and the like is applied to the scan line 13, the signal line 14, and a capacitor bus line 27, the pixel transistor 19 and the like are not broken. Accordingly, the protective circuit has a structure for releasing charge to a common wiring 29 or a common wiring 28 when surge voltage is applied to the protective circuit.

In Embodiment 1, a protective circuit 24 is provided on the scan line 13 side, a protective circuit 25 is provided on the signal line 14 side, and a protective circuit 26 is provided on the capacitor bus line 27. Needless to say, the structures of the protective circuits are not limited to those above.

Figure 2:
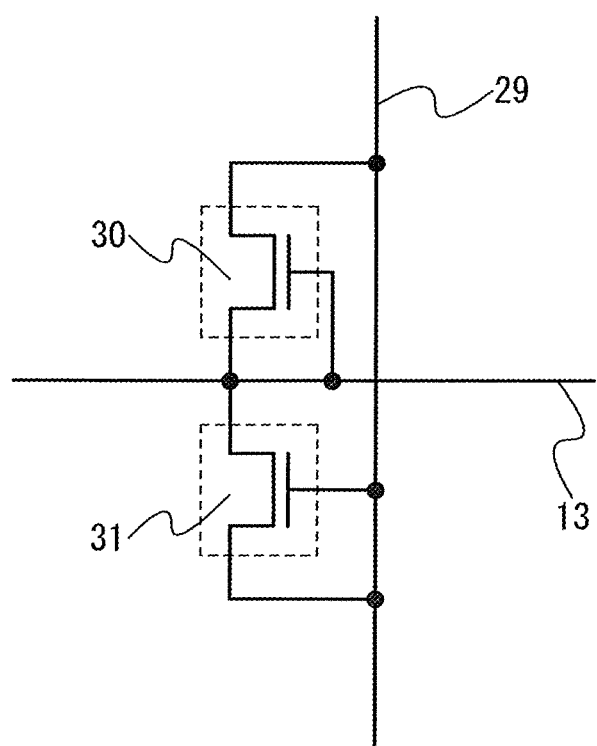
FIG. 2 illustrates an example of a protective circuit.

FIG. 2 illustrates an example of the protective circuit. This protective circuit includes a non-linear element 30 and a non-linear element 31 which are arranged in parallel with respect to the scan line 13. Each of the non-linear element 30 and the non-linear element 31 includes a two-terminal element such as a diode or a three-terminal element such as a transistor. For example, the non-linear element can be formed through the same steps as the pixel transistor of the pixel portion. For example, characteristics similar to those of a diode can be achieved by connecting a gate terminal to a drain terminal of the non-linear element.

A first terminal (gate) and a third terminal (drain) of the non-linear element 30 are connected to the scan line 13, and a second terminal (source) thereof is connected to the common wiring 29. A first terminal (gate) and a third terminal (drain) of the non-linear element 31 are connected to the common wiring 29, and a second terminal (source) thereof is connected to the scan line 13. That is, the protective circuit illustrated in FIG. 2 includes two transistors whose rectifying directions are opposite to each other and which connect the scan line 13 and the common wiring 29 to each other. In other words, between the scan line 13 and the common wiring 29 exist the transistor whose rectifying direction is from the scan line 13 to the common wiring 29 and the transistor whose rectifying direction is from the common wiring 29 to the scan line 13.

In the protective circuit illustrated in FIG. 2, in a case where the scan line 13 is charged positively or negatively with respect to the common wiring 29 due to static electricity or the like, current flows in a direction that cancels the charge. For example, if the scan line 13 is positively charged, current flows in a direction in which the positive charge is released to the common wiring 29. Owing to this operation, the electrostatic breakdown or the shift in threshold voltage of the pixel transistor 19 connected to the charged scan line 13 can be prevented. Moreover, it is possible to prevent dielectric breakdown of the insulating film between the charged scan line 13 and another wiring that intersects with the charged scan line 13 with an insulating layer therebetween.

Figure 3:
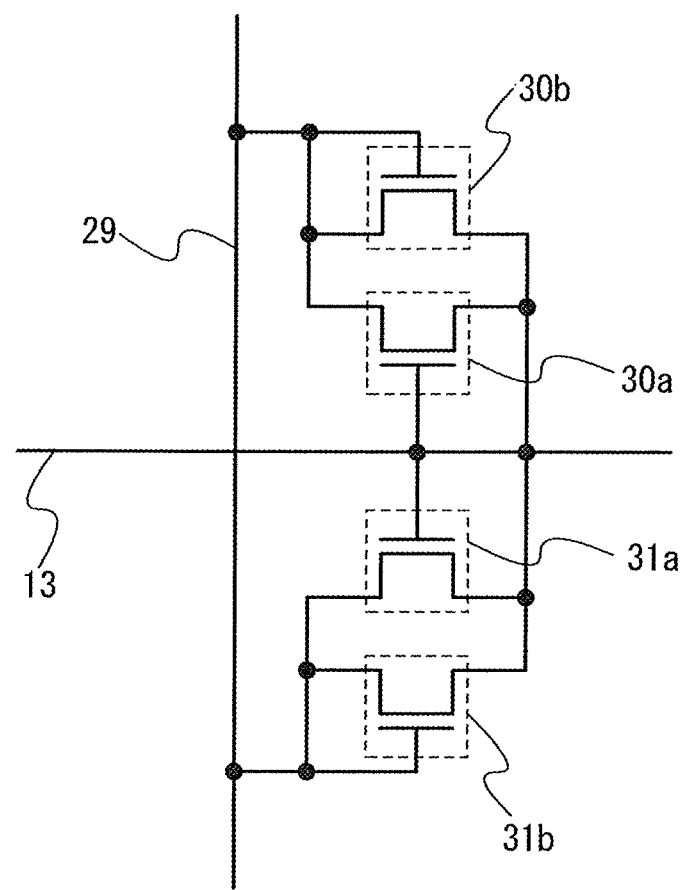
FIG. 3 illustrates an example of a protective circuit.
Figure 6A:
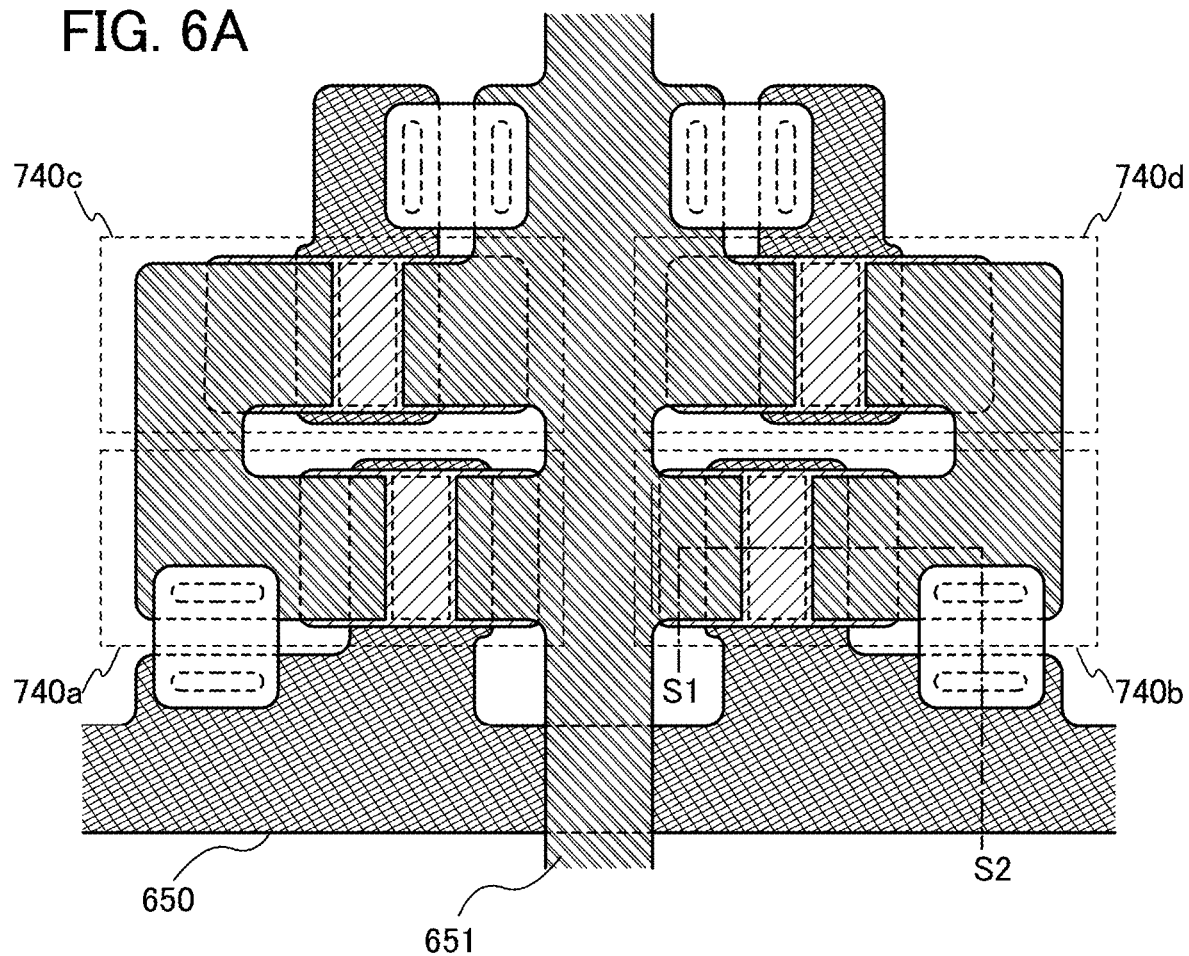
FIGS. 6A and 6B are plan views illustrating an example of a protective circuit.
Figure 6B:
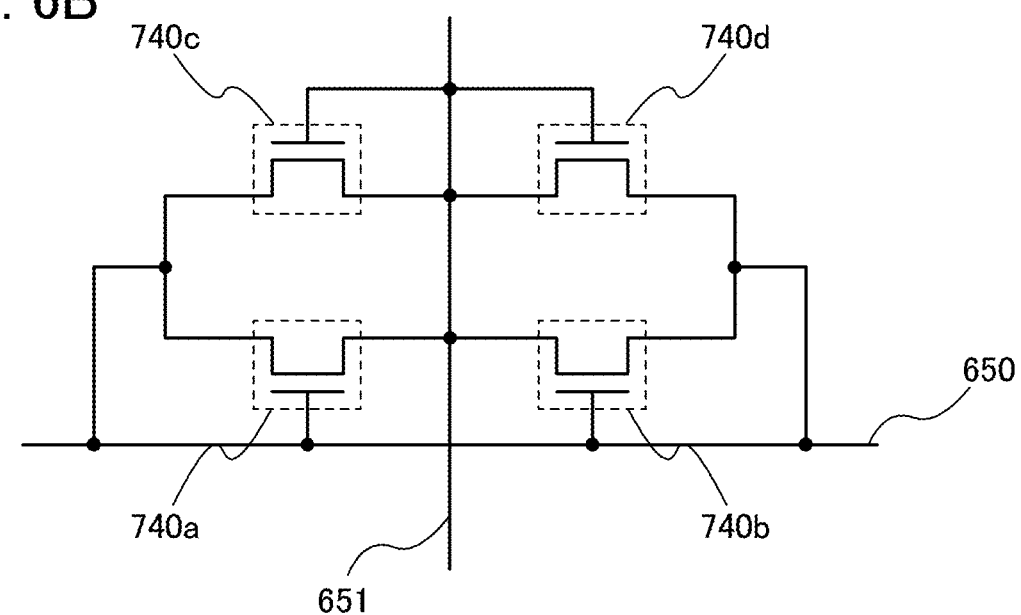

Note that in FIG. 2, a pair of the non-linear element 30 whose first terminal (gate) is connected to the scan line 13 and the non-linear element 31 whose first terminal (gate) is connected to the common wiring 29 is used; that is, the rectifying directions of the non-linear element 30 and the non-linear element 31 are opposite to each other. The common wiring 29 and the scan line 13 are connected via the second terminal (source) and the third terminal (drain) of each non-linear element; that is, the non-linear element 30 and the non-linear element 31 are in parallel. As another structure, a non-linear element may be further added in parallel connection, so that the operation stability of the protective circuit may be enhanced. For example, FIG. 3 illustrates a protective circuit including a non-linear element 30a and a non-linear element 30b, and a non-linear element 31a and a non-linear element 31b, which is provided between the scan line 13 and the common wiring 29. This protective circuit includes four non-linear elements in total: two non-linear elements (30b and 31b), a first terminal (gate) of each of which is connected to the common wiring 29 and two non-linear elements (30a and 31a), a first terminal (gate) of each of which is connected to the scan line 13. That is to say, two pairs of non-linear elements are connected between the common wiring 29 and the scan line 13, each pair including two non-linear elements provided so that their rectifying directions are opposite to each other. In other words, between the scan line 13 and the common wiring 29, there are two transistors the rectifying direction of each of which is from the scan line 13 to the common wiring 29 and two transistors the rectifying direction of each of which is from the common wiring 29 to the scan line 13. When the common wiring 29 and the scan line 13 are connected to each other with the four non-linear elements in this manner, it is possible to prevent, even if surge voltage is applied to the scan line 13 and moreover even if the common wiring 29 is charged by static electricity or the like, the charge from directly flowing through the scan line 13. Note that FIG. 6A illustrates an example in which four non-linear elements 740a, 740b, 740c and 740d are provided over a substrate and FIG. 6B is an equivalent circuit diagram thereof. Here, reference numerals 650 and 651 show a scan line and common wiring, respectively.

Figure 7A:
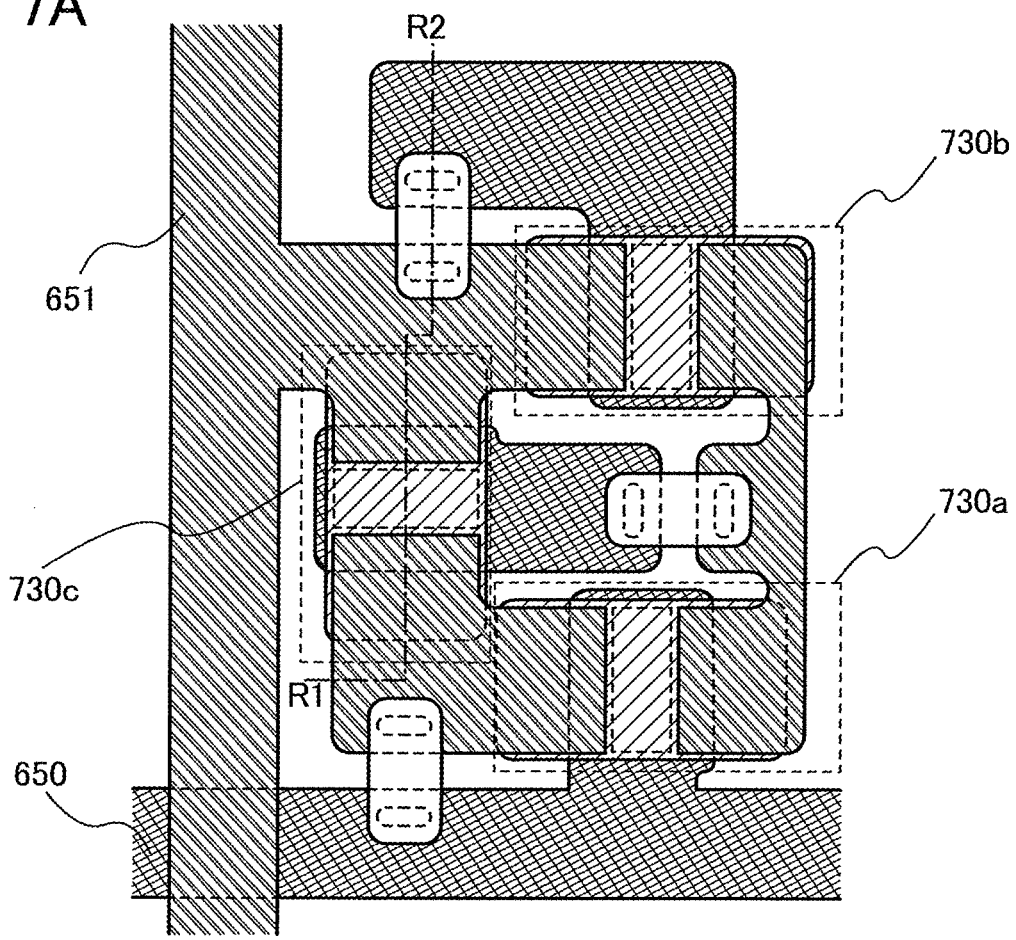
FIGS. 7A and 7B are plan views illustrating an example of a protective circuit.
Figure 7B:
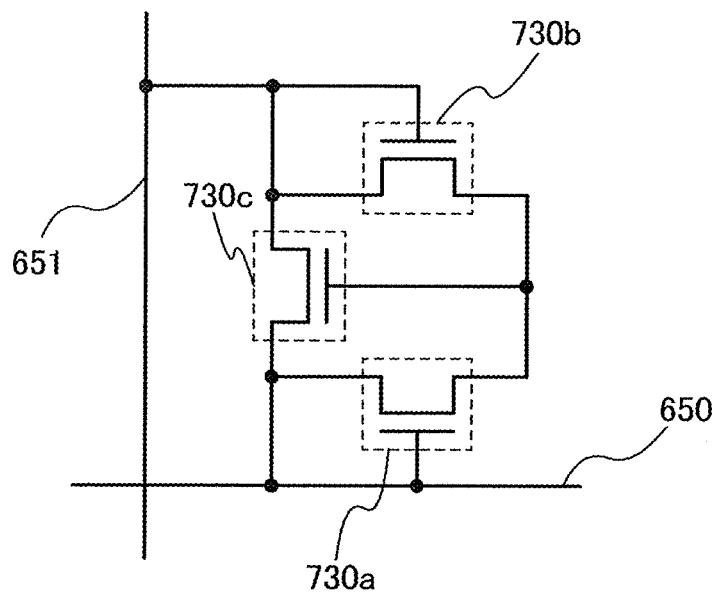

FIG. 7A illustrates an example of a protective circuit which is formed using an odd number of non-linear elements over a substrate, and FIG. 7B is an equivalent circuit diagram thereof. In this circuit, a non-linear element 730b and a non-linear element 730a are connected to a non-linear element 730c as switching elements. By the serial connection of the non-linear elements in this manner, instantaneous load applied to the non-linear elements of the protective circuit can be deconcentrated. Here, reference numerals 650 and 651 show a scan line and common wiring, respectively.

FIG. 2 illustrates the protective circuit which is provided on the scan line 13 side; however, a protective circuit with a similar structure can be provided on the signal line 14 side.

Figure 4A:
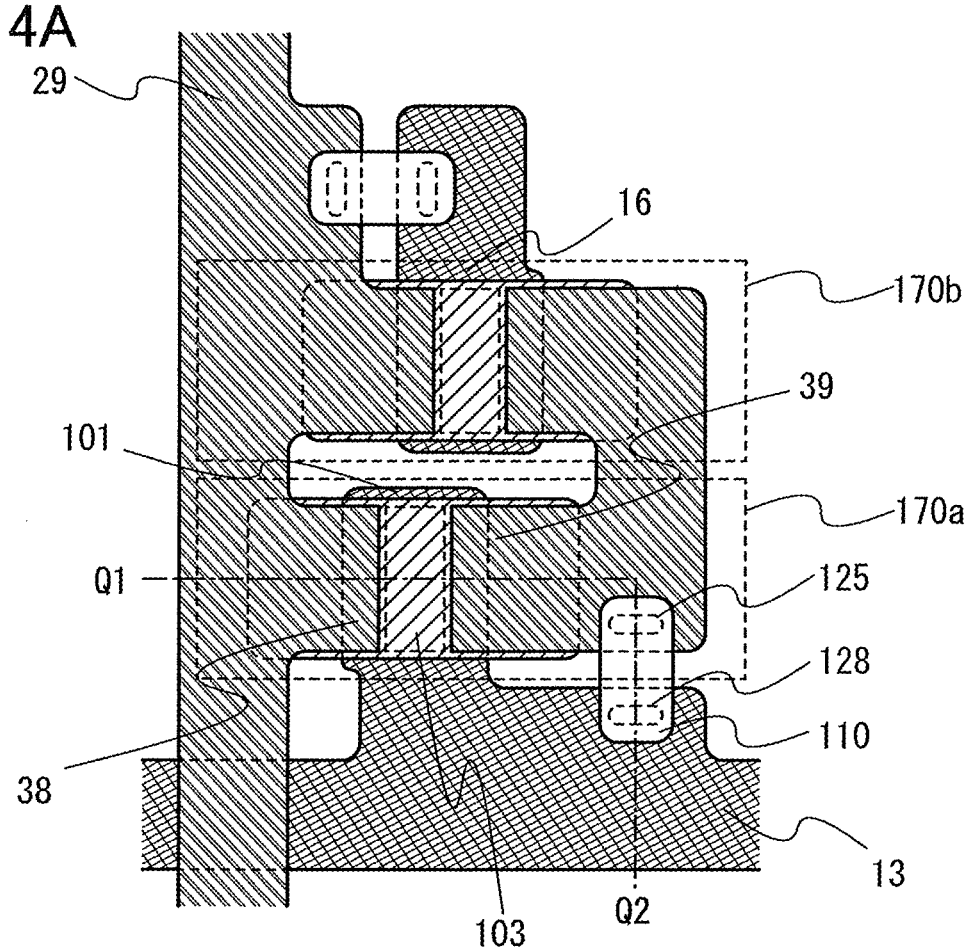
FIGS. 4A and 4B are plan views illustrating an example of a protective circuit.
Figure 4B:
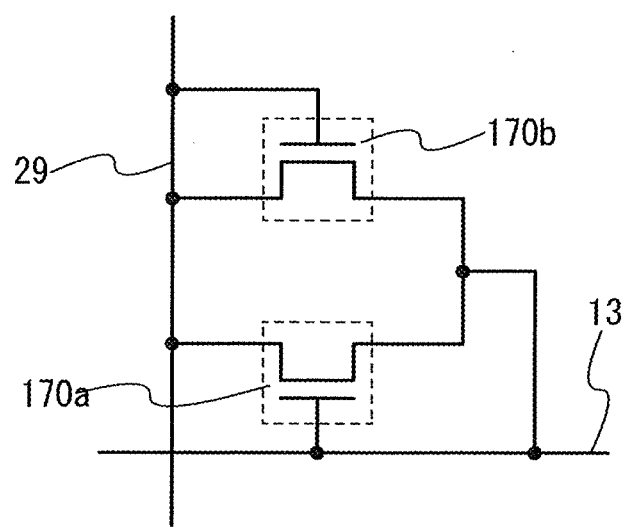

FIG. 4A is a plan view illustrating an example of a protective circuit and FIG. 4B is an equivalent circuit diagram thereof. FIGS. 5A and 5B are cross-sectional views taken along line Q1-Q2 of FIG. 4A. A structure example of the protective circuit is described below with reference to FIGS. 4A and 4B and FIGS. 5A and 5B.

The non-linear element 170a and the non-linear element 170b include a gate electrode 101 and a gate electrode 16, respectively, which are formed using the same layer as the scan line 13. A gate insulating layer 102 is formed over the gate electrode 101 and the gate electrode 16. A first oxide semiconductor layer 103 is formed over the gate insulating layer 102, and a first wiring layer 38 and a second wiring layer 39 are provided so as to face with each other over the gate electrode 101. The gate insulating layer 102 is formed of an oxide such as silicon oxide or aluminum oxide. Note that the non-linear element 170a and the non-linear element 170b have the same structure in the main portion.

The first oxide semiconductor layer 103 is provided so as to cover the gate electrode 101 with the gate insulating film therebetween, below the first wiring layer 38 and the second wiring layer 39 which are opposed to each other. That is, the first oxide semiconductor layer 103 is provided so as to overlap with the gate electrode 101 and be in contact with a top face of the gate insulating layer 102, and bottom faces of second oxide semiconductor layers 104a and 104b. Here, the first wiring layer 38 has a structure in which the second oxide semiconductor layer 104a and the conductive layer 105a are stacked in that order from the first oxide semiconductor layer 103 side and the second wiring layer 39 has a structure in which the second oxide semiconductor layer 104b and the conductive layer 105b are stacked in that order from the first oxide semiconductor layer 103 side.

The first oxide semiconductor layer 103 has higher oxygen concentration than the second oxide semiconductor layers (104a and 104b). In other words, the first oxide semiconductor layer 103 is oxygen-excess type, while the second oxide semiconductor layers (104a and 104b) are oxygen-deficiency type. Since the donor-type defects can be reduced by increasing the oxygen concentration of the first oxide semiconductor layer 103, there are advantageous effects of longer carrier lifetime and higher mobility. On the other hand, when the oxygen concentration of the second oxide semiconductor layers (104a and 104b) is made lower than that of the first oxide semiconductor layer 103, the carrier concentration can be increased and the second oxide semiconductor layers (104a and 104b) can be utilized for forming a source region and a drain region.

As for the structure of the oxide semiconductor, the first oxide semiconductor layer 103 is a non-single-crystal oxide semiconductor layer including In, Ga, Zn and O, and has at least an amorphous component and the second oxide semiconductor layers (104a and 104b) are each a non-single-crystal oxide semiconductor layer including In, Ga, Zn and O, and include a nanocrystal in an non-single-crystal structure in some cases. Then, the first oxide semiconductor layer 103 has characteristics that the electrical conductivity thereof is lower than that of the second oxide semiconductor layers (104a and 104b). Therefore, the second oxide semiconductor layers (104a and 104b) in the non-linear element 170a and the non-linear element 170b of Embodiment 1 can have functions similar to those of a source region and a drain region of a transistor. The second oxide semiconductor layer 104a serving as a source region and the second oxide semiconductor layer 104b serving as a drain region have n-type conductivity and the activation energy ($\Delta E$) of from 0.01 eV to 0.1 eV, and the second oxide semiconductor layers (104a and 104b) can also be called $n^+$ regions.

The first oxide semiconductor layer 103 and the second oxide semiconductor layers (104a and 104b) are formed from zinc oxide (ZnO) typically, or an oxide semiconductor including In, Ga, and Zn.

The second oxide semiconductor layers (104a and 104b) are provided in contact with and between the first oxide semiconductor layer 103 and the conductive layers (105a and 105b), and junction of the oxide semiconductor layers which have different properties is obtained. By provision of the second oxide semiconductor layers (104a and 104b) having higher electrical conductivity than the first oxide semiconductor layer 103, between the first oxide semiconductor layer and the conductive layers, stable operation becomes possible as compared with Schottky junction formed in the case where the first oxide semiconductor layer and the conductive layers are in direct contact with each other. That is, the thermal stability is increased, so that the stable operation becomes possible. Accordingly, the function of the protective circuit is enhanced and stable operation can be achieved. Moreover, the junction leakage can be reduced and the characteristics of the non-linear element 170a and the non-linear element 170b can be improved.

A protective insulating film 107 is provided over the first oxide semiconductor layer 103. The protective insulating film 107 is formed of an oxide such as silicon oxide or aluminum oxide. Further, by stacking silicon nitride, aluminum nitride, silicon oxynitride, or aluminum oxynitride over silicon oxide or aluminum oxide, the function as the protective film can be enhanced.

In any case, when the protective insulating film 107 being in contact with the first oxide semiconductor layer 103 is an oxide, it is possible to prevent oxygen from being extracted from the first oxide semiconductor layer 103 and prevent the first oxide semiconductor layer 103 from changing into an oxygen-deficiency type. Moreover, by the structure where the first oxide semiconductor layer 103 is not in direct contact with an insulating layer including nitride, it is possible to prevent hydrogen in the nitride from diffusing and causing defects in the first oxide semiconductor layer 103 due to a hydroxyl group or the like.

The protective insulating film 107 is provided with contact holes 125 and 128 where the scan line 13 formed using the same layer as the gate electrode 101 is connected to a third terminal (drain) of the non-linear element 170a. This connection is made by a third wiring layer 110 formed from the same material as the pixel electrode of the pixel portion. The third wiring layer 110 is formed from a material which is used for forming a transparent conductive film, for example, from indium tin oxide (ITO), zinc oxide (ZnO), tin oxide ($SnO_2$), or the like. Thus, the third wiring layer 110 has higher resistance than a wiring formed from a metal material. When the protective circuit includes the wirings including such a resistant component, it is possible to prevent an excessive amount of current from flowing through the non-linear element 170a from being destroyed.

Although FIGS. 4A and 4B and FIGS. 5A and 5B illustrate the example of the protective circuit provided for the scan line 13, a similar protective circuit can be applied to a signal line, a capacitor bus line, or the like.

According to Embodiment 1, by the provision of the protective circuit including the oxide semiconductor in this manner, a display device having a structure which is suitable for a protective circuit can be provided. Thus, the function of the protective circuit can be enhanced and the operation can be stabilized.

Embodiment 2

In Embodiment 2, an embodiment of a process for manufacturing a display device in which the pixel portion and a protective circuit including non-linear elements around the pixel portion illustrated in FIG. 4A of Embodiment 1 are formed is described with reference to FIGS. 8A to 8C and FIGS. 9A to 9C. FIGS. 8A to 8C and FIGS. 9A to 9C are cross-sectional views taken along line Q1-Q2 of FIG. 4A.

In FIG. 8A, a glass substrate of barium borosilicate glass, aluminoborosilicate glass, aluminosilicate glass, or the like available in the market can be used as the substrate 100 having a light-transmitting property. For example, a glass substrate which includes more barium oxide (BaO) than boric acid ($B_2O_3$) in composition ratio and whose strain point is 730° C. or higher is preferable. This is because the glass substrate is not strained even when the oxide semiconductor layer is thermally processed at high temperatures of about 700° C.

Next, a conductive layer is formed entirely over the substrate 100. After that, a resist mask is formed by a first photolithography process, and an unnecessary portion is removed by etching to form wirings and an electrode (such as a gate wiring including a gate electrode 101, a capacitor wiring, and a terminal). At this time, the etching is performed so that at least an end portion of the gate electrode 101 is tapered.

The gate wiring including the gate electrode 101, the capacitor wiring, and the terminal of a terminal portion are desirably formed from a low-resistance conductive material such as aluminum (Al) or copper (Cu); however, since aluminum itself has disadvantages such as low heat resistance and a tendency to be corroded, it is used in combination with a conductive material having heat resistance. As a conductive material having heat resistance, an element selected from titanium (Ti), tantalum (Ta), tungsten (W), molybdenum (Mo), chromium (Cr), neodymium (Nd), or scandium (Sc), or an alloy including any of the elements, an alloy film including a combination of such elements, or a nitride film including any of the elements can be used.

Subsequently, a gate insulating layer 102 is formed entirely over the gate electrode 101. The gate insulating layer 102 is formed by a sputtering method or the like to a thickness of 50 nm to 250 nm.

For example, a silicon oxide film is formed by a sputtering method to a thickness of 100 nm as the gate insulating layer 102. Needless to say, the gate insulating layer 102 is not limited to such a silicon oxide film and may be a single layer or a stack of layers including another insulating film, such as a silicon oxynitride film, a silicon nitride film, an aluminum oxide film, or a tantalum oxide film.

Next, plasma treatment is performed on the gate insulating layer 102 prior to formation of the first oxide semiconductor layer. Here, reverse sputtering where plasma is generated by introduction of an oxygen gas and an argon gas into a deposition chamber is performed, so that the gate insulating layer is subjected to treatment using oxygen radicals or oxygen. Thus, dust adhering to the surface is removed and moreover the surface of the gate insulating layer is modified into an oxygen-excess region. It is effective to perform the oxygen radical treatment on the surface of the gate insulating layer so that the surface is made into an oxygen-excess region, because an oxygen supply source for modifying the interface between the gate insulating layer and the first oxide semiconductor layer is made in thermal treatment (200° C. to 600° C.) for increasing the reliability in a later step.

The gate insulating layer, the first oxide semiconductor layer, and the second oxide semiconductor layer can be formed by a sputtering method successively without exposure to air by changing the gas introduced to the chamber and the target set in the chamber as appropriate. The successive film formation without exposure to air can prevent impurity mixture. In the case of successive film formation without exposure to air, a manufacturing apparatus of multichamber type is preferable.

In particular, it is preferable to successively form the gate insulating layer 102 in contact with the first oxide semiconductor layer and the first oxide semiconductor layer. By the successive film formation like this, an interface between stacked layers can be formed without being contaminated by an atmospheric constituent such as moisture or a contaminant impurity element or dust existing in the atmosphere. Thus, variations in characteristics of the non-linear elements and thin film transistors can be reduced.

Note that the term "successive film formation" in this specification means that during a series of steps of from a first film-formation step by sputtering to a second film-formation step by sputtering, an atmosphere in which a substrate to be processed is disposed is not contaminated by a contaminant atmosphere such as air, and is constantly controlled to be vacuum or an inert gas atmosphere (a nitrogen atmosphere or a rare gas atmosphere). By the successive film formation, film formation can be conducted to a substrate which has been cleaned, without re-attachment of moisture or the like.

Next, the first oxide semiconductor layer is formed in such a manner that the substrate on which the plasma treatment has been performed is not exposed to air. The first oxide semiconductor layer formed in such a manner that the substrate on which the plasma treatment has been performed is not exposed to air can avoid the trouble that dust or moisture adheres to the interface between the gate insulating layer and the semiconductor film. Here, the first oxide semiconductor layer is formed in an oxygen atmosphere under the condition where the target is an oxide semiconductor target including In, Ga, and Zn (composition ratio is $In_2O_3:Ga_2O_3:ZnO=1:1:1$) with a diameter of 8 inches, the distance between the substrate and the target is set at 170 mm, the pressure is set at 0.4 Pa, and the direct current (DC) power supply is set at 0.5 kW. Note that a pulse direct current (DC) power supply is preferable because dust can be reduced and the film thickness can be uniform. The thickness of the first oxide semiconductor layer is set to 5 nm to 200 nm. The thickness of the first oxide semiconductor layer in Embodiment 2 is 100 nm.

When the first oxide semiconductor layer is formed under the different condition from the second oxide semiconductor layer, the first oxide semiconductor layer has different composition from the second oxide semiconductor layer; for example, the first oxide semiconductor layer includes more oxygen than the second oxide semiconductor layer. In this case, for example, as compared with the oxygen gas flow rate and the argon gas flow rate in the deposition condition of the second oxide semiconductor layer, the oxygen gas flow rate in the deposition condition of the first oxide semiconductor layer is increased. Specifically, the second oxide semiconductor layer is formed in a rare gas (such as argon or helium) atmosphere (or a gas including oxygen at 10% or less and argon at 90% or more), while the first oxide semiconductor layer is formed in an oxygen atmosphere (or a mixed gas of oxygen and argon with the flow rate of oxygen being more than that of argon, and the oxygen gas flow rate:the argon gas flow rate=1:1 or more). When the first oxide semiconductor layer includes more oxygen than the second oxide semiconductor layer, the first oxide semiconductor layer can have lower electrical conductivity than the second oxide semiconductor layer. Moreover, when the first oxide semiconductor layer includes a large amount of oxygen, the amount of off current can be reduced; therefore, a thin film transistor with a high on/off ratio can be provided.

The first oxide semiconductor layer may be formed in the same chamber as the chamber where the reverse sputtering is performed previously, or may be formed in a different chamber from the chamber where the reverse sputtering is performed previously as long as the film formation can be performed without exposure to air.

Next, a second oxide semiconductor layer is formed over the first oxide semiconductor layer by a sputtering method. Here, sputtering deposition is performed under the condition where a target includes indium oxide ($In_2O_3$), gallium oxide ($Ga_2O_3$), and zinc oxide (ZnO) at a composition ratio of 1:1:1 (=$In_2O_3:Ga_2O_3:ZnO$), the distance between the target and the substrate is 170 mm, the pressure in a deposition chamber is set at 0.4 Pa, the DC electric power is set at 0.5 kW, the deposition temperature is set to room temperature, and the argon gas flow rate is set at 40 sccm. Thus, a semiconductor film including In, Ga, Zn, and oxygen as components is formed as the second oxide semiconductor layer. Although the target where the composition ratio is $In_2O_3:Ga_2O_3:ZnO=1:1:1$ is used intentionally, an oxide semiconductor film including a crystal grain which has a size of 1 nm to 10 nm just after the film formation is often obtained. It can be said that the presence or absence of crystal grains and the density of crystal grains can be controlled and the diameter of the crystal grain can be adjusted within 1 nm to 10 nm, all by adjusting as appropriate, the deposition condition of reactive sputtering, such as the target composition ratio, the deposition pressure (0.1 Pa to 2.0 Pa), the electric power (250 W to 3000 W: 8 inchesϕ), the temperature (room temperature to 100° C.), and the like. The thickness of the second oxide semiconductor layer is set to 5 nm to 20 nm. Needless to say, in the case where the film includes crystal grains, the size of the crystal grain does not exceed the film thickness. In Embodiment 2, the second oxide semiconductor layer has a thickness of 5 nm.

Next, a second photolithography process is performed to form a resist mask, and the first oxide semiconductor layer and the second oxide semiconductor layer are etched. Here, wet etching is performed using ITO07N (product of Kanto Chemical Co., Inc.) to remove an unnecessary portion; thus, a first oxide semiconductor layer 103 and a second oxide semiconductor layer 111 are formed. Note that the etching here may be dry etching, without being limited to wet etching. The cross-section at this phase is illustrated in FIG. 8B.

Next, a conductive film 132 is formed from a metal material over the second oxide semiconductor layer 111 and the gate insulating layer 102 by a sputtering method or a vacuum evaporation method. As the material of the conductive film 132, there are an element selected from Al, Cr, Ta, Ti, Mo, and W, an alloy including the above element, an alloy film in which some of the above elements are combined, and the like.

When heat treatment is conducted at 200° C. to 600° C., the conductive film preferably has heat resistant property so as to endure this heat treatment. Since aluminum itself has disadvantages such as low heat resistance and a tendency to be corroded, it is used in combination with a conductive material having heat resistance. As a conductive material having heat resistance, which can be used in combination with Al, an element selected from titanium (Ti), tantalum (Ta), tungsten (W), molybdenum (Mo), chromium (Cr), neodymium (Nd), or scandium (Sc), or an alloy including any of the elements, an alloy film including a combination of such elements, or a nitride film including any of the elements can be used.

In this embodiment, the conductive film 132 has a three-layer structure in which a Ti film is formed, an aluminum film including Nd (Al—Nd) is stacked over the Ti film, and another Ti film is stacked thereover. Alternatively, the conductive film 132 may have a two-layer structure in which a Ti film is stacked over an Al film. Further alternatively, the conductive film 132 may have a single-layer structure of an aluminum film including silicon or a titanium film. The cross section at this phase is illustrated in FIG. 8C.

Figure 9A:
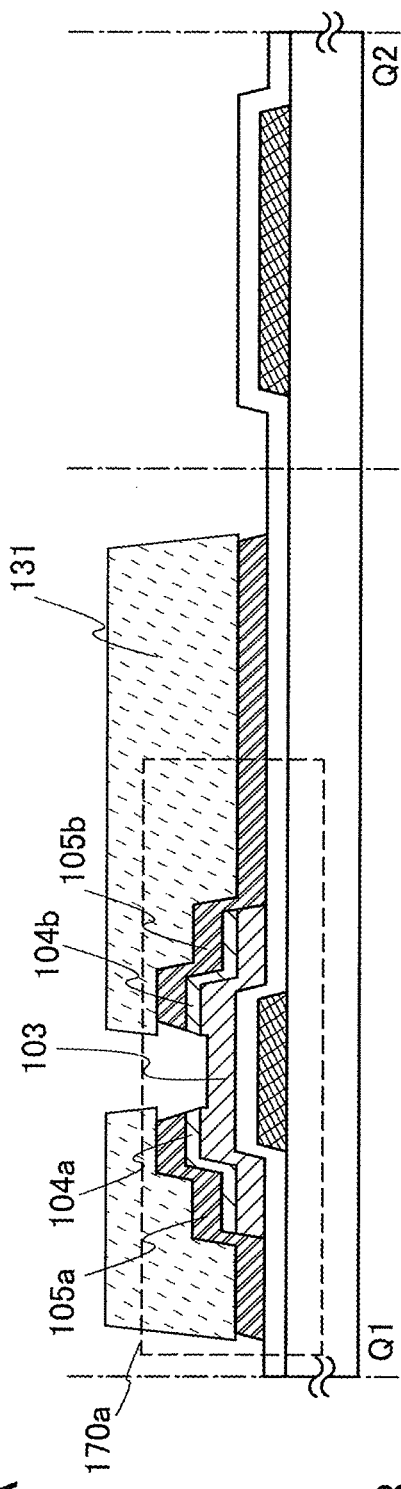
FIGS. 9A to 9C are cross-sectional views illustrating a process for manufacturing a protective circuit.

Next, a third photolithography process is performed to form a resist mask 131, and an unnecessary part of the conductive film 132 is removed by etching. Thus, conductive layers 105a and 105b are formed (FIG. 9A). At this time, dry etching or wet etching can be used as the etching. Here, dry etching is employed using a mixed gas of $SiCl_4$, $Cl_2$, and $BCl_3$ to etch the conductive film in which the Ti film, the aluminum film including Nd (Al—Nd) and the Ti film are stacked. In this manner, the conductive layers 105a and 105b are formed.

Next, the second oxide semiconductor layer is etched using the same mask as that used for the etching the conductive film 132. Here, wet etching is performed using ITO07N (product of Kanto Chemical Co., Inc.) to remove an unnecessary portion; thus, second oxide semiconductor layers 104a and 104b are formed. Note that the etching at this time may be dry etching, without being limited to wet etching. In addition, although depending on the etching conditions, an exposed region of the first oxide semiconductor layer 103 is also etched in the etching process of the second oxide semiconductor layer 111. Thus, a channel formation region of the first oxide semiconductor layer 103 between the second oxide semiconductor layers 104a and 104b is a region with a small thickness as illustrated in FIG. 9A.

Further, the first oxide semiconductor layer 103 may be subjected to oxygen plasma treatment. By the plasma treatment, damages by etching of the first oxide semiconductor layer 103 can be repaired. In typical oxygen plasma treatment, the surface of an oxide semiconductor is processed by radicals generated from an oxygen gas by glow discharge plasma. However, as a gas from which plasma is generated, a mixed gas of an oxygen gas and a rare gas may be used, as well as oxygen.

Next, thermal treatment at 200° C. to 600° C., typically 300° C. to 500° C., is preferably performed. In this case, thermal treatment is performed in a furnace at 350° C. for an hour in a nitrogen atmosphere. This thermal treatment allows atoms of the semiconductor layers including In, Ga, and Zn to be rearranged. Since the distortion that interrupts carrier movement is released by this thermal treatment, the thermal treatment at this time (including photo-annealing) is important. There is no particular limitation on when to perform the thermal treatment as long as it is performed after the formation of the first oxide semiconductor layer; for example, it is performed after the formation of the protective film. Through these steps, the non-linear element 170a in which the first oxide semiconductor layer 103 is a channel formation region is completed. A cross-sectional view at this phase is illustrated in FIG. 9A.

Next, the resist mask is removed, and a protective insulating film 107 covering the semiconductor layers including In, Ga and Zn is formed. The protective insulating film 107 can be formed using a silicon nitride film, a silicon oxide film, a silicon oxynitride film, an aluminum oxide film, a tantalum oxide film, or the like by a sputtering method or the like.

Figure 9B:
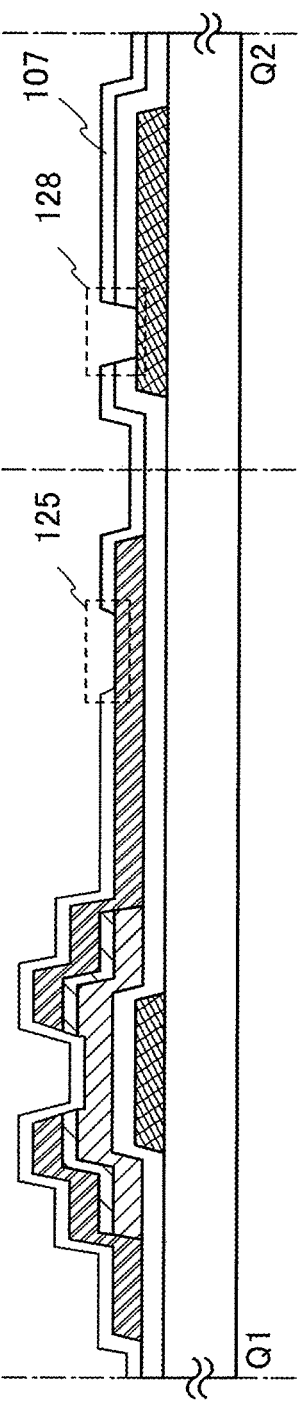

Next, a fourth photolithography process is performed to form a resist mask, and the protective insulating film 107 is etched. Thus, a contact hole 125 that reaches the conductive layer 105b is formed. In order to reduce the number of masks used, it is preferable to etch the gate insulating layer 102 by using the same resist mask so as to form a contact hole 128 that reaches the gate electrode. A cross-sectional view at this phase is illustrated in FIG. 9B.

Then, the resist mask is removed, and then a transparent conductive film is formed. As a material for the transparent conductive film, indium oxide ($In_2O_3$), indium oxide-tin oxide alloy ($In_2O_3$—$SnO_2$, abbreviated to ITO), or the like can be given, and it can be formed by a sputtering method, a vacuum evaporation method, or the like. Etching treatment of such materials is performed using a chlorinated acid based solution. However, since etching of ITO particularly tends to leave residue, an alloy of indium oxide and zinc oxide ($In_2O_3$—ZnO) may be used in order to improve etching processability.

Next, a fifth photolithography process is performed to form a resist mask, and an unnecessary portion of the transparent conductive film is removed. Thus, a pixel electrode is formed, which is not illustrated.

Moreover, in this fifth photolithography process, a capacitor wiring and the pixel electrode together form a storage capacitor in a capacitor portion, which is not illustrated, by using the gate insulating layer 102 and the protective insulating film 107 as dielectrics.

Moreover, in this fifth photolithography process, the resist mask covers a terminal portion, so that the transparent conductive film formed in the terminal portion is left. The transparent conductive film serves as an electrode or a wiring used for connection with an FPC, a terminal electrode for connection which functions as an input terminal of a source wiring, or the like.

Moreover, in Embodiment 2, the conductive layer 105b serving as a drain electrode layer of the non-linear element 170a is connected to the scan line 108 via the third wiring layer 110 formed using the transparent conductive film through the contact holes 125 and 126, and thereby the protective circuit is formed.

Figure 9C:
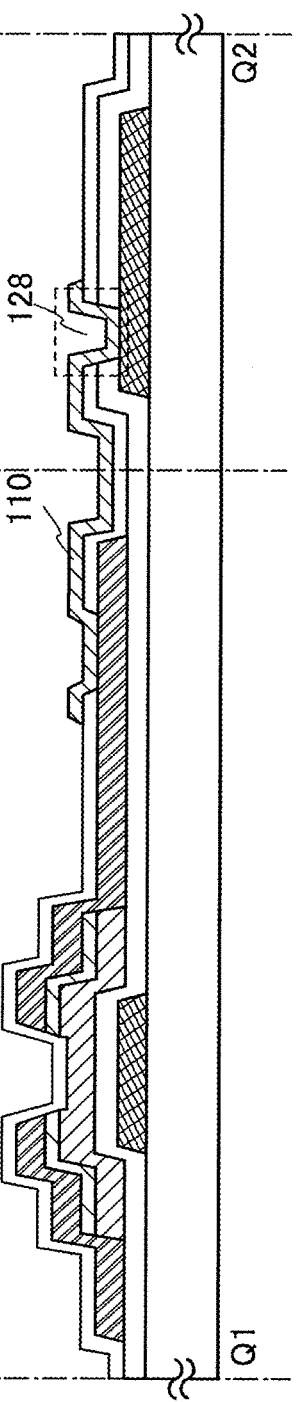

Then, the resist mask is removed. A cross-sectional view at this phase is illustrated in FIG. 9C.

Through the five photolithography processes performed in the above manner, the protective circuit having the plurality of non-linear elements (in Embodiment 2, the two non-linear elements 170a and 170b) can be completed by using the five photomasks. In the connection structure between the first oxide semiconductor layer of the non-linear element and the wiring layers, the provision of the region which is bonded with the second oxide semiconductor layer, which has higher electrical conductivity than the first oxide semiconductor layer, allows stable operation as compared with a case of using only metal wirings. According to Embodiment 2, a plurality of TFTs can be completed together with a non-linear element by a similar method together with the non-linear elements. Therefore, a pixel portion including bottom-gate n-channel TFTs and a protective circuit can be manufactured at the same time. In other words, an active matrix display device substrate, on which a protective diode which has fewer defects due to film peeling, is mounted, can be manufactured in accordance with the steps described in Embodiment 2.

Embodiment 3

In Embodiment 3, an example of a display device including a pixel portion and a protective circuit including a non-linear element provided around the pixel portion, which is different from that of Embodiment 2, will now be described with reference to FIG. 27.

Figure 27:
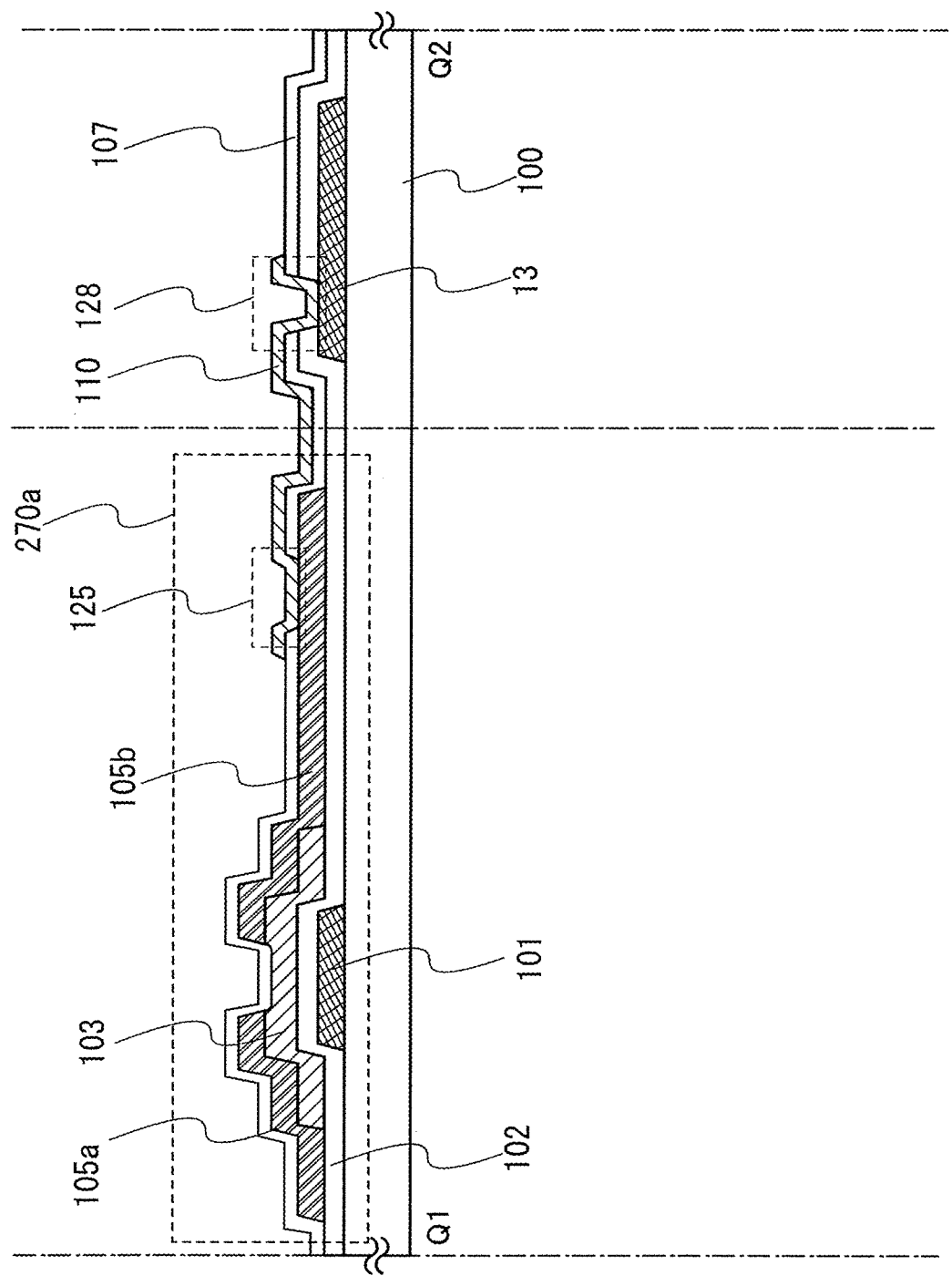
FIG. 27 is a cross-sectional view illustrating an example of a protective circuit.

FIG. 27 is a cross-sectional view of a display device in which a thin film transistor arranged in a pixel portion and a protective circuit including a non-linear element are formed over the same substrate. In a non-linear element 270a, conductive layers (105a and 105b) serving as a source electrode and a drain electrode are provided in contact with the first oxide semiconductor layer 103.

In the non-linear element 270a, the conductive layer 105a and the conductive layer 105b are preferably in contact with the first oxide semiconductor layer 103 which is modified by plasma treatment. In Embodiment 3, the first oxide semiconductor layer 103 is subjected to plasma treatment before formation of the conductive layers.

As the plasma treatment, for example, reverse sputtering can be conducted. The plasma treatment can be conducted by using an argon gas, a hydrogen gas, or a mixed gas of argon and hydrogen. Further, an oxygen gas may be contained in such a gas. Alternatively, another rare gas may be used, instead of the argon gas.

The conductive layer is etched to form the conductive layers (105a and 105b) serving as a source electrode and a drain electrode. In Embodiment 3, a titanium film is wet-etched by an ammonium hydrogen peroxide mixture (hydrogen peroxide:ammonia:water=5:2:2) or the like to form the conductive layers (105a and 105b) serving as a source electrode and a drain electrode. In this etching step, part of an exposed region of the first oxide semiconductor layer including In, Ga and Zn is etched. Thus, a region sandwiched between the conductive layer 105a and the conductive layer 105b, that is, a channel formation region of the first oxide semiconductor layer 103 has a small thickness as illustrated in FIG. 27.

By formation of the conductive layers (105a and 105b) serving as a source electrode and a drain electrode in contact with the first oxide semiconductor layer 103 modified by the plasma treatment, contact resistance between the first oxide semiconductor layer 103 and the conductive layers (105a and 105b) serving as a source electrode and a drain electrode can be reduced. In addition, the bonding strength between the first oxide semiconductor layer 103 and the conductive layers (105a and 105b) serving as a source electrode and a drain electrode is improved by the plasma treatment, and thereby defects due to film peeling hardly occurs.

Through the above-described steps, a display device having a highly reliable protective circuit as a non-linear semiconductor device can be manufactured.

Embodiment 4

Embodiment 4 illustrates an example of electronic paper in which a protective circuit and a TFT in a pixel portion are provided over one substrate, as a display device according to one embodiment of the present invention.

Figure 10:
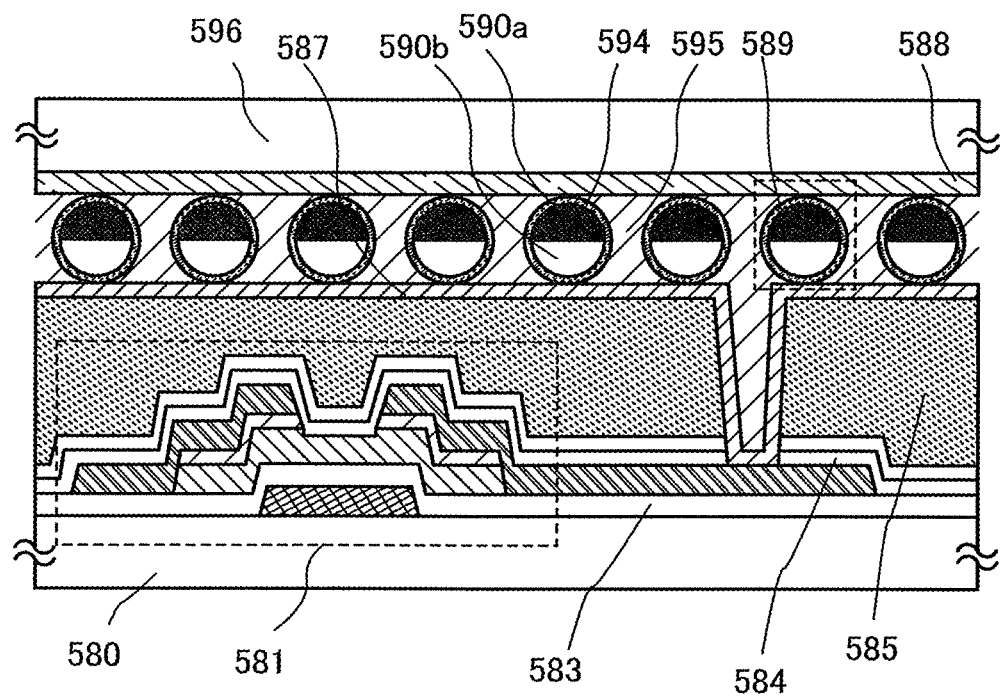
FIG. 10 is a cross-sectional view of electronic paper.

FIG. 10 illustrates active matrix type electronic paper device as an example of a display device according to one embodiment of the present invention. A thin film transistor 581 used for a semiconductor device can be manufactured in a manner similar to the non-linear element described in Embodiment 2, and has high electrical characteristics, in which an oxide semiconductor including In, Ga and Zn is used for a semiconductor layer and a source region and a drain region.

The electronic paper in FIG. 10 is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 has a bottom-gate structure in which the source electrode layer or the drain electrode layer is electrically connected to a first electrode layer 587 through an opening formed in insulating layers. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The circumference of the spherical particle 589 is filled with filler 595 such as a resin or the like (see FIG. 10).

Further, instead of the twisting ball, an electrophoretic element can be used. A microcapsule having a diameter of about 10 μm to 20 μm, which is filled with transparent liquid, positively-charged white microparticles and negatively-charged black microparticles, is used. In the microcapsule which is provided between the first electrode layer and the second electrode layer, when an electric field is applied by the first electrode layer and the second electrode layer, the white microparticles and the black microparticles move to opposite sides to each other, so that white or black can be displayed. A display element using this principle is an electrophoretic display element, and is called electronic paper in general. The electrophoretic display element has higher reflectance than a liquid crystal display element, and thus, an assistant light is unnecessary. Moreover, power consumption is low and a display portion can be recognized in a dusky place. Furthermore, an image which is displayed once can be retained even when power is not supplied to the display portion. Accordingly, a displayed image can be stored even though a semiconductor device having a display function (which is also referred to simply as a display device or a semiconductor device provided with a display device) is distanced from an electric wave source which serves as a power supply.

Through the above steps, in the connection structure between the first oxide semiconductor layer of the non-linear element and the wiring layers, the provision of the region which is bonded with the second oxide semiconductor layer, which has higher electrical conductivity than the first oxide semiconductor layer, allows stable operation as compared with a case of using only metal wirings. Accordingly, the function of the protective circuit is enhanced and the operation can be made stable. Moreover, it is possible to manufacture a highly-reliable electronic paper device having stable operation, by incorporating a protective circuit including the non-linear elements in which defects due to the peeling of the thin films are not easily caused.

Embodiment 4 can be implemented in combination with any structure of the other embodiments as appropriate.

Embodiment 5

Embodiment 5 describes an example of manufacturing at least a protective circuit, part of a driver circuit, and a thin film transistor of a pixel portion over one substrate in a display device which is an example of a semiconductor device according to one embodiment of the present invention, with reference to FIGS. 11A and 11B, FIG. 12, FIG. 13, FIG. 14, FIG. 15 and FIG. 16.

The thin film transistor in the pixel portion formed over the same substrate as the protective circuit is formed in a manner similar to the non-linear element described in Embodiment 2 or 3. The thin film transistor is formed to be an n-channel TFT; therefore, part of a driver circuit which can be formed using an n-channel TFT is formed over the same substrate as the thin film transistor in the pixel portion.

Figure 11A:
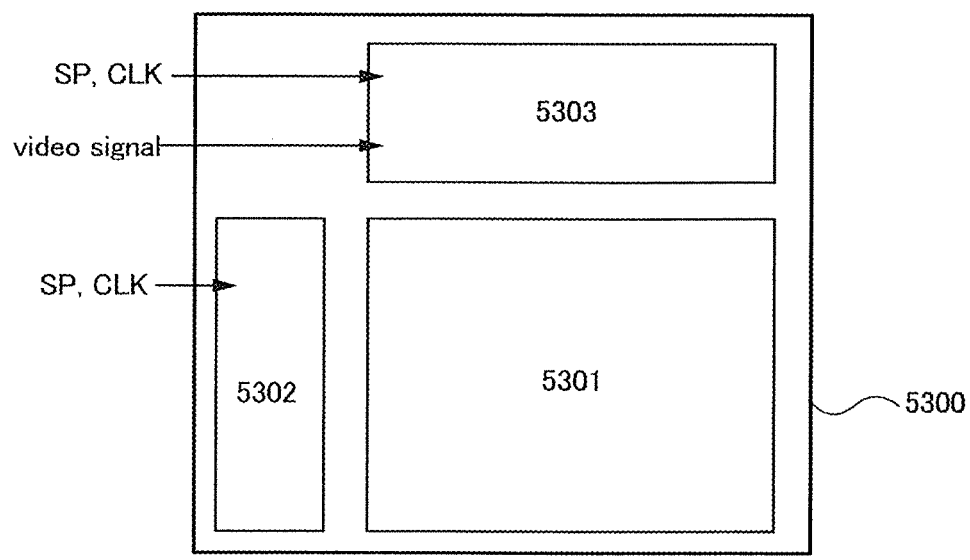
FIGS. 11A and 11B are each a block diagram of a semiconductor device.

FIG. 11A illustrates an example of a block diagram of an active matrix liquid crystal display device which is an example of a semiconductor device according to one embodiment of the present invention. The display device illustrated in FIG. 11A includes over a substrate 5300, a pixel portion 5301 including a plurality of pixels each provided with a display element; a scan line driver circuit 5302 that selects a pixel; and a signal line driver circuit 5303 that controls a video signal input to a selected pixel.

The pixel portion 5301 is connected to the signal line driver circuit 5303 with a plurality of signal lines S1 to Sm (not illustrated) extending in a column direction from the signal line driver circuit 5303 and connected to the scan line driver circuit 5302 with a plurality of scan lines G1 to Gn (not illustrated) extending in a row direction from the scan line driver circuit 5302. The pixel portion 5301 includes a plurality of pixels (not illustrated) arranged in matrix, corresponding to the signal lines S1 to Sm and the scan lines G1 to Gn. In addition, each of the pixels is connected to a signal line Sj (any one of the signal lines S1 to Sm) and a scan line Gi (any one of the scan lines G1 to Gn).

The thin film transistor that can be formed together with a non-linear element by a method similar to that of the non-linear element described in Embodiment 2 or 3 is an n-channel TFT, and a signal line driver circuit including an n-channel TFT is described with reference to FIG. 12.

Figure 12:
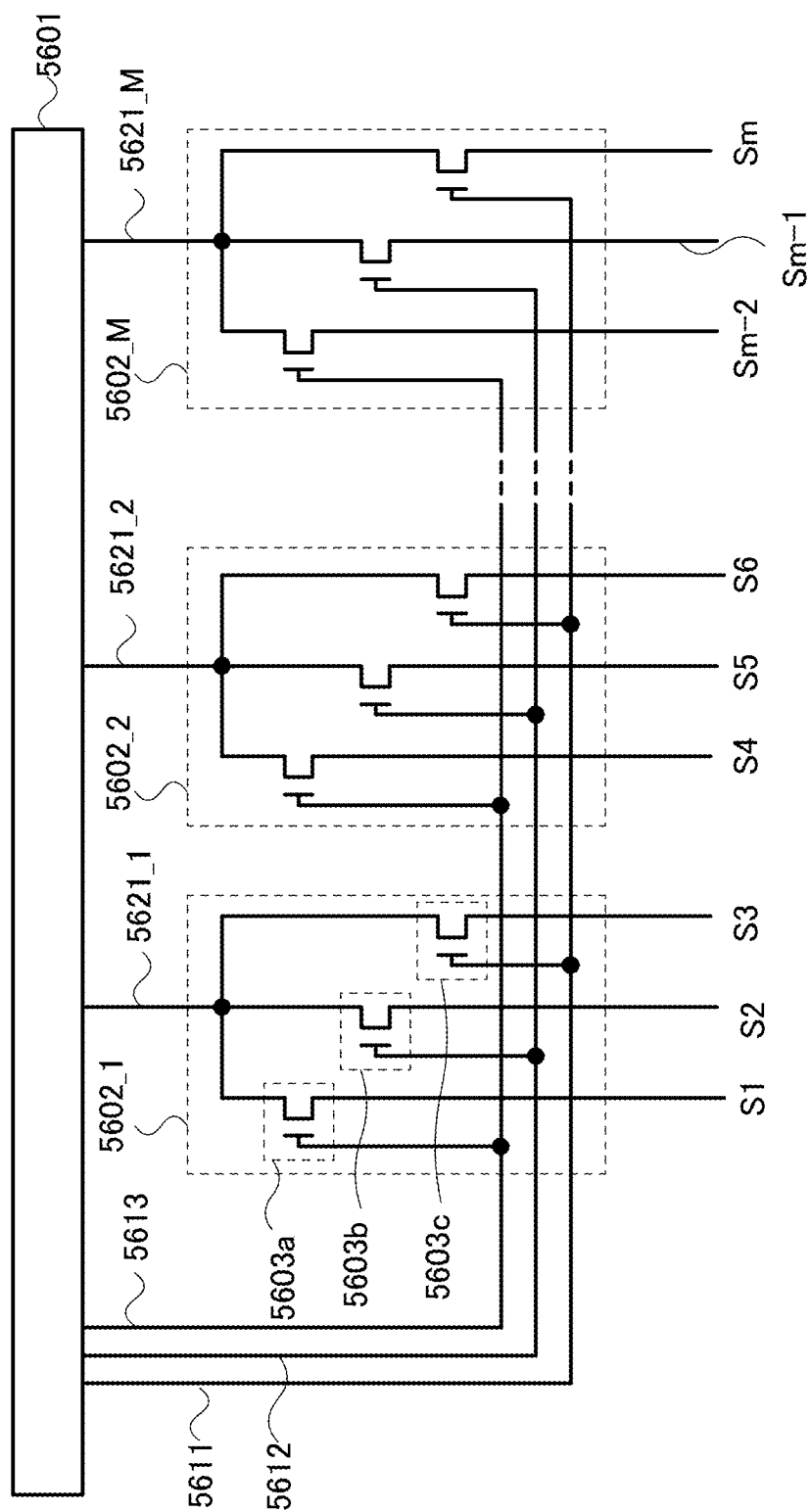
FIG. 12 illustrates a structure of a signal line driver circuit.

The signal line driver circuit in FIG. 12 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and one of the wirings 5621_1 to 5621_M corresponding to the switch groups 5602_1 to 5602_M, respectively. Each of the wirings 5621_1 to 5621_M is connected to three signal lines through the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 through the first thin film transistor 5603a, the second thin film transistor 5603b, and the third thin film transistor 5603c of the switch group 5602_J.

Note that a signal is input to each of the first wiring 5611, the second wiring 5612, and the third wiring 5613.

Note that the driver IC 5601 is preferably formed on a single-crystal substrate. The switch groups 5602_1 to 5602_M are preferably formed over the same substrate as the pixel portion. Therefore, the driver IC 5601 may be connected to the switch groups 5602_1 to 5602_M through an FPC or the like.

Figure 13:
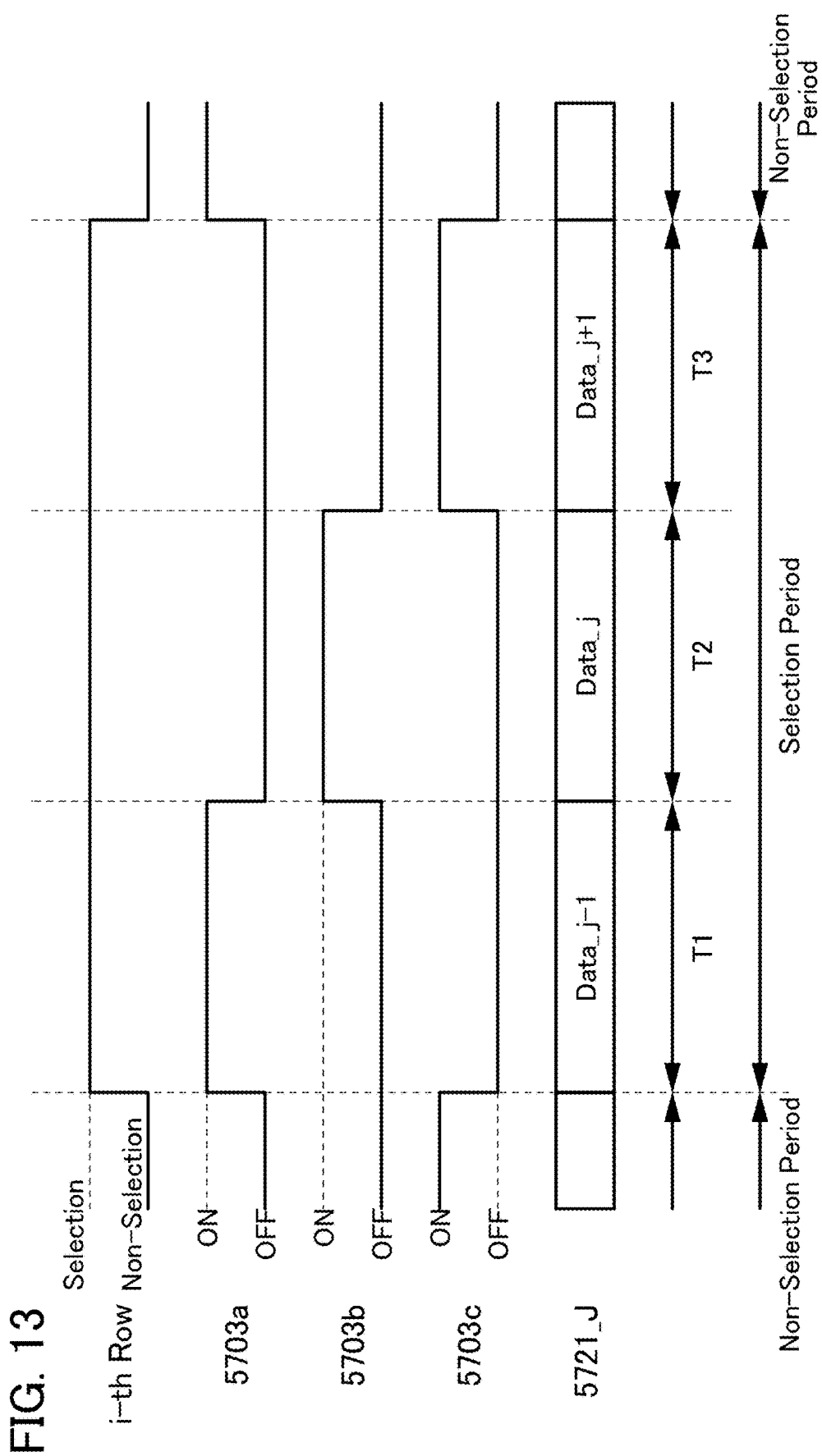
FIG. 13 is a timing chart of operation of a signal line driver circuit.

Next, operation of the signal line driver circuit in FIG. 12 is described with reference to a timing chart of FIG. 13. FIG. 13 illustrates the timing chart where a scan line Gi in the i-th row is selected. A selection period of the scan line Gi in the i-th row is divided into a first sub-selection period TI, a second sub-selection period T2, and a third sub-selection period T3. In addition, the signal line driver circuit in FIG. 12 operates similarly to FIG. 13 also when a scan line of another row is selected.

Note that the timing chart in FIG. 13 illustrates a case where the wiring 5621_J in the J-th column is connected to the signal line Sj−1, the signal line Sj, and the signal line Sj+1 through the first thin film transistor 5603a, the second thin film transistor 5603b, and the third thin film transistor 5603c.

The timing chart of FIG. 13 illustrates timing when the scan line Gi in the i-th row is selected, timing 5703a when the first thin film transistor 5603a is turned on/off, timing 5703b when the second thin film transistor 5603b is turned on/off, timing 5703c when the third thin film transistor 5603c is turned on/off, and a signal 5721_J input to the wiring 5621_J in the J-th column.

In the first sub-selection period Ti, the second sub-selection period T2, and the third sub-selection period T3, different video signals are input to the wirings 5621_1 to 5621_M. For example, a video signal input to the wiring 5621_J in the first sub-selection period Ti is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period Ti, the second sub-selection period T2, and the third sub-selection period T3, the video signals input to the wiring 5621_J are denoted by Data_j−1, Data_j, and Data_j+1.

As illustrated in FIG. 13, in the first sub-selection period Ti, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 12, by dividing one gate selection period into three, video signals can be input to three signal lines from one wiring 5621 in one gate selection period. Therefore, in the signal line driver circuit in FIG. 12, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 12 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective the sub-selection periods as illustrated in FIG. 12.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 14:
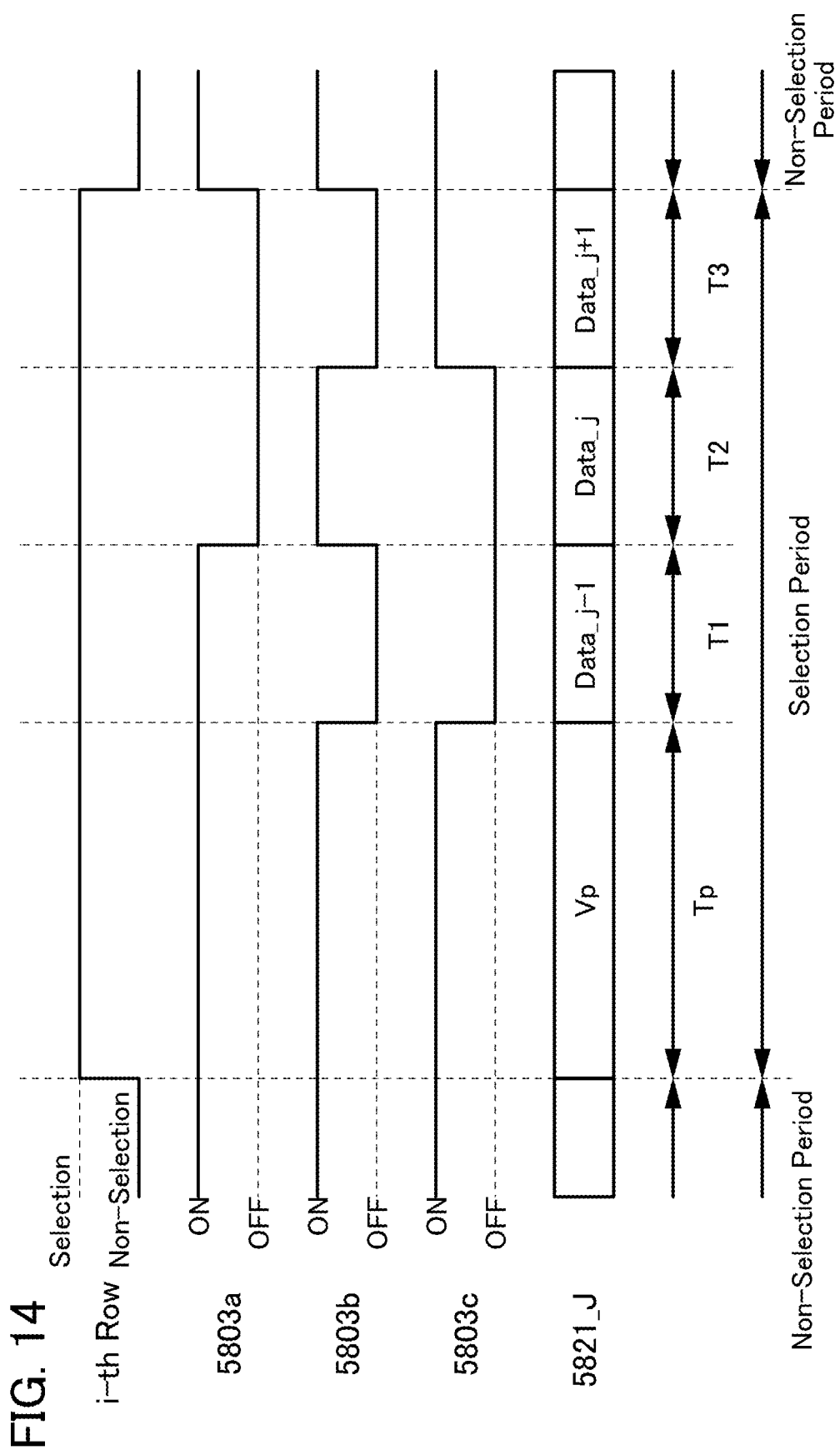
FIG. 14 is a timing chart of operation of a signal line driver circuit.

As another example, one gate selection period may be divided into a precharge period Tp, the first sub-selection period Ti, the second sub-selection period T2, and the third sub-selection period T3 as illustrated in a timing chart in FIG. 14. The timing chart in FIG. 14 illustrates timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 14, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period Ti, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 12 to which the timing chart in FIG. 14 is applied, the video signal can be written to the pixel at high speed because the signal line can be precharged by providing a precharge selection period before a sub-selection period. Note that portions in FIG. 14 which are similar to those of FIG. 13 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large current can be used.

One mode of a shift register which is used for a part of a scan line driver circuit is described with reference to FIG. 15 and FIG. 16.

Figure 15:
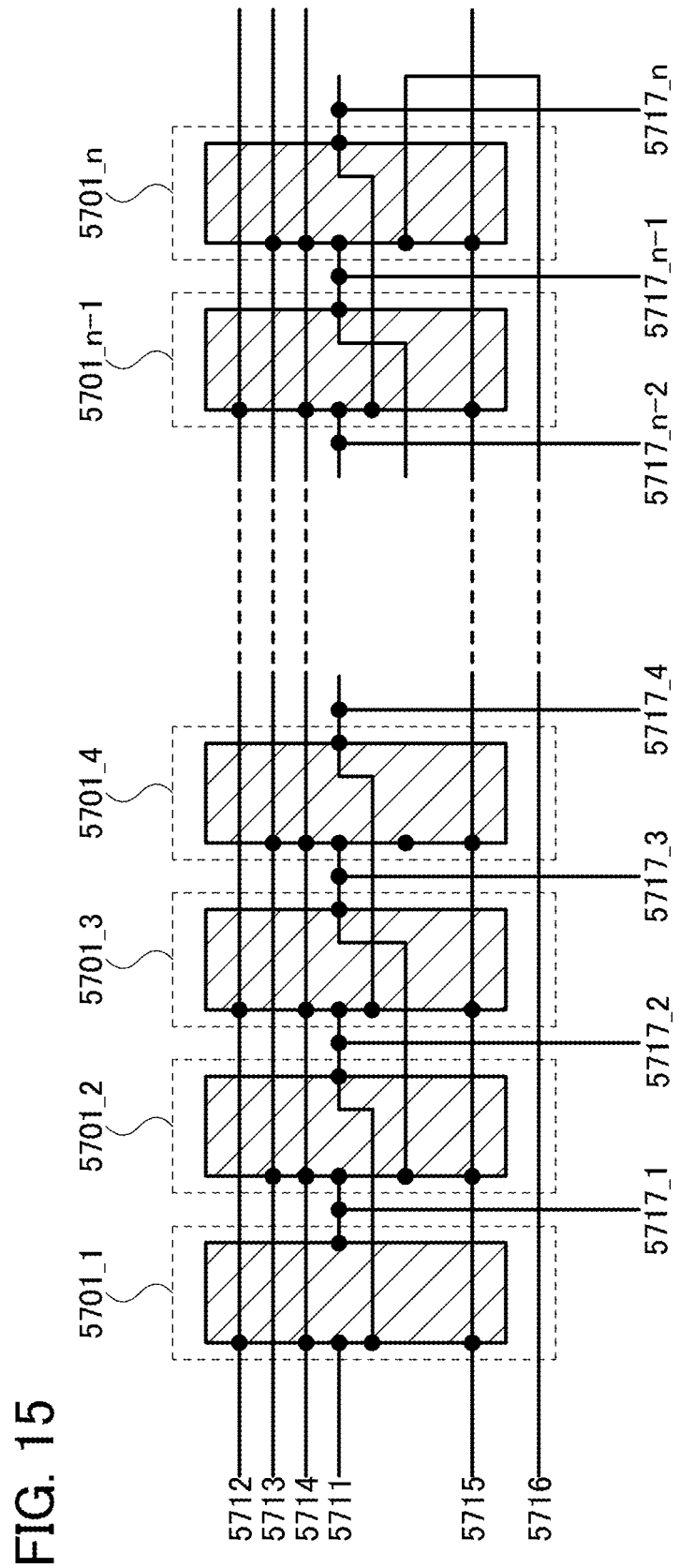
FIG. 15 is a diagram illustrating a structure of a shift register.

FIG. 15 illustrates a circuit configuration of the shift register. The shift register illustrated in FIG. 15 includes a plurality of flip-flops (flip-flops 5701-1 to 5701-n). The shift register is operated with input of a first clock signal, a second clock signal, a start pulse signal, and a reset signal.

Connection relations of the shift register in FIG. 15 are described. In the i-th stage flip-flop 5701_i (one of the flip-flops 5701-1 to 5701_n) in the shift register of FIG. 15, a first wiring 5501 illustrated in FIG. 16 is connected to a seventh wiring 5717_i−1; a second wiring 5502 illustrated in FIG. 16 is connected to a seventh wiring 5717_i+1; a third wiring 5503 illustrated in FIG. 16 is connected to a seventh wiring 5717_i; and a sixth wiring 5506 illustrated in FIG. 16 is connected to a fifth wiring 5715.

Figure 16:
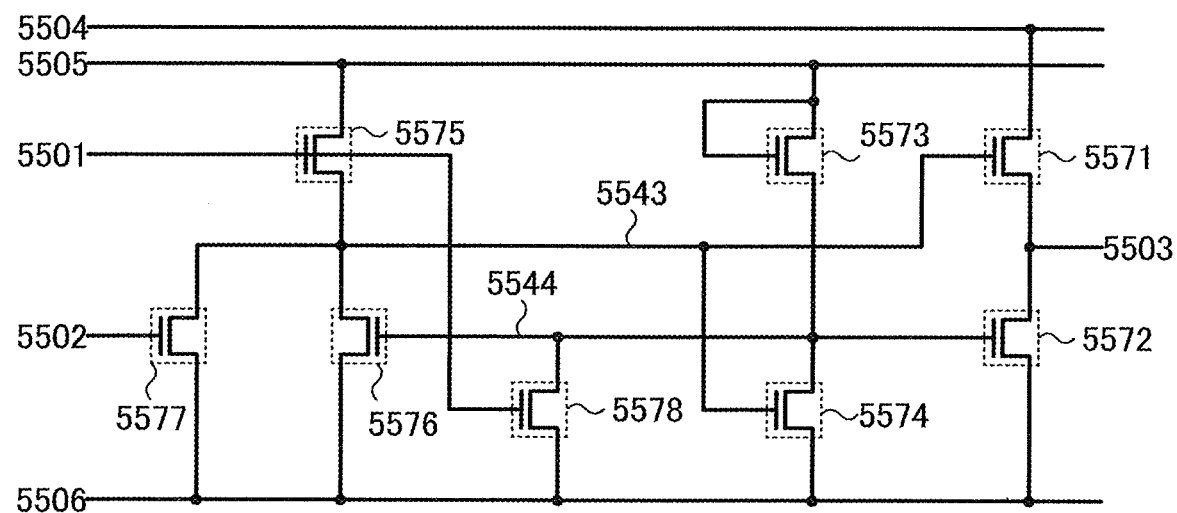
FIG. 16 illustrates a connection structure of a flip-flop of FIG. 14.

Further, a fourth wiring 5504 illustrated in FIG. 16 is connected to a second wiring 5712 in flip-flops of odd-numbered stages, and is connected to a third wiring 5713 in flip-flops of even-numbered stages. A fifth wiring 5505 illustrated in FIG. 16 is connected to a fourth wiring 5714.

Note that the first wiring 5501 of the first stage flip-flop 5701_1 illustrated in FIG. 16 is connected to a first wiring 5711. Moreover, the second wiring 5502 of the n-th stage flip-flop 5701_n illustrated in FIG. 16 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 16 illustrates details of the flip-flop illustrated in FIG. 15. A flip-flop illustrated in FIG. 16 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, the connection structure of the flip-flop illustrated in FIG. 16 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

Alternatively, the signal line driver circuit and the scan line driver circuit can be manufactured using only n-channel TFTs, which can be manufactured together with a non-linear element by a method similar to the method for manufacturing the non-linear element described in Embodiment 2 or 3. Since the n-channel TFTs which can be formed together with the non-linear element by the method similar to the method for manufacturing the non-linear element described in Embodiment 2 or 3 have high mobility, the driving frequency of the driver circuits can be increased. Further, the n-channel TFTs which can be formed together with the non-linear element by the method similar to the method for manufacturing the non-linear element described in Embodiment 2 or 3 include source regions or drain regions which are formed using an oxygen-deficiency oxide semiconductor layer including indium, gallium, and zinc. Therefore, the parasitic capacitance is decreased and the frequency characteristic (called f-characteristic) is increased. For example, the scan line driver circuit including the n-channel TFTs which can be formed together with a non-linear element by the method similar to the method for manufacturing the non-linear element described in Embodiment 2 or 3 can operate at high speed; therefore, it is possible to increase the frame frequency or to achieve insertion of a black screen, for example.

In addition, when the channel width of the transistor in the scan line driver circuit is increased or a plurality of scan line driver circuits is provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

In the case of manufacturing an active matrix type light-emitting display device, which is an example of a semiconductor device according to one embodiment of the present invention, a plurality of scan line driver circuits are preferably arranged because a plurality of thin film transistors are arranged in at least one pixel. An example of a block diagram of an active matrix light-emitting display device is illustrated in FIG. 11B.

Figure 11B:
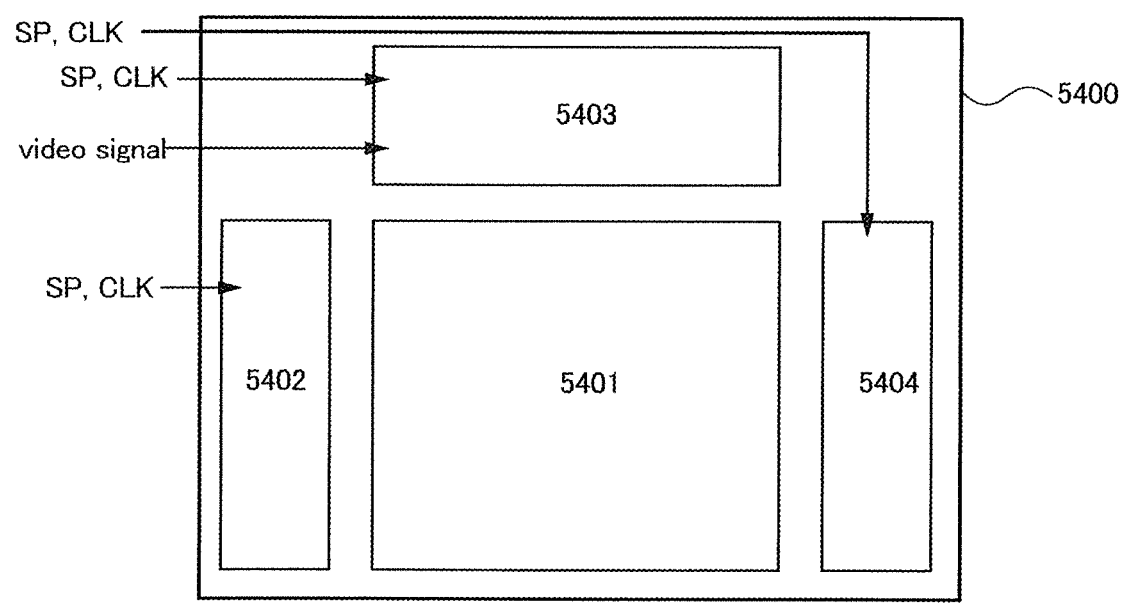

The light-emitting display device illustrated in FIG. 11B includes, over a substrate 5400, a pixel portion 5401 including a plurality of pixels each provided with a display element; a first scan line driver circuit 5402 and a second scan line driver circuit 5404 that select each pixel; and a signal line driver circuit 5403 that controls a video signal input to a selected pixel.

In the case of inputting a digital video signal to the pixel of the light-emitting display device of FIG. 11B, the pixel is put in a light-emitting state or non-light-emitting state by switching on/off of the transistor. Thus, grayscale can be displayed using an area ratio grayscale method or a time ratio grayscale method. An area ratio grayscale method refers to a driving method by which one pixel is divided into a plurality of subpixels and the respective subpixels are driven separately based on video signals so that grayscale is displayed. Further, a time ratio grayscale method refers to a driving method by which a period during which a pixel is in a light-emitting state is controlled so that grayscale is displayed.

Since the response time of light-emitting elements is shorter than that of liquid crystal elements or the like, the light-emitting elements are suitable for a time ratio grayscale method. Specifically, in the case of displaying by a time grayscale method, one frame period is divided into a plurality of subframe periods. Then, in response to video signals, the light-emitting element in the pixel is put in a light-emitting state or a non-light-emitting state in each subframe period. By dividing a frame into a plurality of subframes, the total length of time in which pixels actually emit light in one frame period can be controlled with video signals to display grayscales.

Note that in the light-emitting display device of FIG. 11B, in a case where one pixel includes two TFTs, that is, a switching TFT and a current control TFT, a signal which is input to a first scan line serving as a gate wiring of the switching TFT is generated from the first scan line driver circuit 5402 and a signal which is input to a second scan line serving as a gate wiring of the current control TFT is generated from the second scan line driver circuit 5404. However, the signal which is input to the first scan line and the signal which is input to the second scan line may be generated together from one scan line driver circuit. In addition, for example, there is a possibility that a plurality of the first scan lines used for controlling the operation of the switching element be provided in each pixel depending on the number of transistors included in the switching element. In this case, the signals which are input to the first scan lines may be generated all from one scan line driver circuit or may be generated from a plurality of scan line driver circuits.

Even in the light-emitting display device, part of the driver circuit which can be formed using the n-channel TFTs can be provided over one substrate together with the thin film transistors of the pixel portion. Moreover, the signal line driver circuit and the scan line driver circuit can be manufactured using only the n-channel TFTs which can be formed together with a non-linear element by a method similar to the method for manufacturing the non-linear element described in Embodiment 2 or 3.

The aforementioned driver circuit may be used for not only a liquid crystal display device or a light-emitting display device but also electronic paper in which electronic ink is driven by utilizing an element electrically connected to a switching element. The electronic paper is also called an electrophoretic display device (electrophoretic display) and has advantages in that it has the same level of readability as regular paper, it has less power consumption than other display devices, and it can be set to have a thin and light form.

Electrophoretic displays can have various modes. Electrophoretic displays contain a plurality of microcapsules dispersed in a solvent or a solute, each microcapsule containing first particles which are positive-charged and second particles which are negative-charged. By applying an electric field to the microcapsules, the particles in the microcapsules are moved in opposite directions and only the color of the particles concentrated on one side is exhibited. It is to be noted that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant move to a high-electric field region. An electrophoretic display does not need to use a polarizer and a counter substrate, which are required in a liquid crystal display device, and both the thickness and weight of the electrophoretic display device can be a half of those of a liquid crystal display device.

A solution in which the aforementioned microcapsules are dispersed in a solvent is referred to as electronic ink. This electronic ink can be printed on a surface of glass, plastic, cloth, paper, or the like. Furthermore, by use of a color filter or particles that have a pigment, color display is possible, as well.

In addition, an active matrix type display device can be completed by providing as appropriate, a plurality of the microcapsules over an active matrix substrate so as to be interposed between two electrodes, and can perform display by application of electric field to the microcapsules. For example, the active matrix substrate obtained using the thin film transistors which can be formed together with a non-linear element by a method similar to the method for manufacturing the non-linear element described in Embodiment 2 or 3 can be used.

Note that the first particles and the second particles in the microcapsule may be formed from one of a conductive material, an insulating material, a semiconductor material, a magnetic material, a liquid crystal material, a ferroelectric material, an electroluminescent material, an electrochromic material, and a magnetophoretic material or a composite material thereof.

Through the above steps, in the connection structure between the first oxide semiconductor layer of the non-linear element and the wiring layers, the provision of the region which is bonded with the second oxide semiconductor layer, which has higher electrical conductivity than the first oxide semiconductor layer, or the provision of the region modified by a plasma treatment, allows stable operation as compared with a case of using only metal wirings. Accordingly, the function of the protective circuit is enhanced and the operation can be made stable. Further, it is possible to manufacture a highly-reliable display device having stable operation, by including a protective circuit including a non-linear element in which defects due to the peeling of the thin films are not easily caused.

Embodiment 5 can be implemented in combination with any structure of the other embodiments as appropriate.

Embodiment 6

A thin film transistor can be manufactured together with a non-linear element according to one embodiment of the present invention, and the thin film transistor can be used for a pixel portion and further for a driver circuit, so that a semiconductor device having a display function (also called a display device) can be manufactured. Moreover, a thin film transistor and a non-linear element according to one embodiment of the present invention can be used for part of a driver circuit or an entire driver circuit formed over one substrate together with a pixel portion, so that a system-on-panel can be formed.

The display device includes a display element. As the display element, a liquid crystal element (also referred to as a liquid crystal display element) or a light-emitting element (also referred to as a light-emitting display element) can be used. A light-emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

In addition, the display device includes a panel in which a display element is sealed, and a module in which an IC and the like including a controller are mounted on the panel. One embodiment of the present invention relates to one mode of an element substrate before the display element is completed in a process for manufacturing the display device, and the element substrate is provided with a means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any other states.

A display device in this specification refers to an image display device, a display device, or a light source (including a lighting device). Further, the display device includes any of the following modules in its category: a module including a connector such as an flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip-on-glass (COG) method.

The appearance and a cross section of a liquid crystal display panel, which is one mode of a display device according to one embodiment of the present invention, will be described in Embodiment 6 with reference to FIGS. 17A and 17B. FIG. 17A is a top view of a panel in which thin film transistors 4010 and 4011 with high electrical characteristics which can be manufactured together with a non-linear element by a method similar to the method for manufacturing the non-linear element, and a liquid crystal element 4013 are sealed by a second substrate 4006 with a sealing material 4005. FIG. 17B corresponds to a cross section thereof along M-N of FIGS. 17A-1 and 17A-2.

The sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed with the sealing material 4005 between the first substrate 4001 and the second substrate 4006. A signal line driver circuit 4003 that is formed using a single crystal semiconductor film or a polycrystalline semiconductor film over a substrate which is prepared separately is mounted in a region that is different from the region surrounded by the sealing material 4005 over the first substrate 4001.

Note that there is no particular limitation on a connection method of the driver circuit which is separately formed, and a known COG method, wire bonding method, TAB method, or the like can be used. FIG. 17A-1 illustrates an example in which the signal line driver circuit 4003 is mounted by a COG method and FIG. 17A-2 illustrates an example in which signal line driver circuit 4003 is mounted by a TAB method.

Each of the pixel portion 4002 and the scan line driver circuit 4004 which are provided over the first substrate 4001 includes a plurality of thin film transistors. FIG. 17B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

Each of the thin film transistors 4010 and 4011 has high electrical characteristics, in which an oxide semiconductor including In, Ga and Zn is used for its semiconductor layer and its source and drain regions, and can be manufactured together with a non-linear element by a method similar to the method for manufacturing the non-linear element described in Embodiment 2 or 3. In Embodiment 6, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 serving as orientation films, respectively, and has the liquid crystal layer 4008 therebetween, with the insulating layers 4032 and 4033 therebetween.

Note that the first substrate 4001 and the second substrate 4006 can be formed from glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer 4035, which is formed by etching an insulating film selectively, is provided to control a distance (a cell gap) between the pixel electrode layer 4030 and the counter electrode layer 4031. Alternatively, a spherical spacer may be used.

Alternatively, a blue phase liquid crystal without an orientation film may be used. A blue phase is a type of liquid crystal phase, which appears just before a cholesteric liquid crystal changes into an isotropic phase when the temperature of the cholesteric liquid crystal is increased. A blue phase appears only within narrow temperature range; therefore, the liquid crystal layer 4008 is formed using a liquid crystal composition in which a chiral agent of 5 wt. % or more is mixed in order to expand the temperature range. The liquid crystal composition including a blue phase liquid crystal and a chiral agent has a short response time of 10 μs to 100 μs, and is optically isotropic; therefore, orientation treatment is not necessary and viewing angle dependence is small.

Note that Embodiment 6 describes an example of a transmissive liquid crystal display device; however, one embodiment of the present invention can be applied to a reflective liquid crystal display device or a semi-transmissive liquid crystal display device.

Although a liquid crystal display device of Embodiment 6 has a polarizer provided outer than the substrate (the viewer side) and a color layer and an electrode layer of a display element provided inner than the substrate, which are arranged in that order, the polarizer may be inner than the substrate. The stacked structure of the polarizer and the color layer is not limited to that described in Embodiment 6 and may be set as appropriate in accordance with the materials of the polarizer and the color layer and the condition of the manufacturing process. Further, a light-blocking film serving as a black matrix may be provided.

In Embodiment 6, in order to reduce the unevenness of the surface of the thin film transistors and to improve the reliability of the thin film transistors, the non-linear element described in Embodiment 2 or 3 and the thin film transistors which can be formed together with a non-linear element by a method similar to the method for manufacturing the non-linear element are covered with protective films or insulating layers (the insulating layers 4020 and 4021) serving as planarizing insulating films. Note that the protective film is provided to prevent entry of a contaminant impurity such as an organic substance, a metal substance, or moisture existing in air, and therefore a dense film is preferable. The protective film may be formed using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although the protective film is formed by a sputtering method in Embodiment 6, the method is not limited to a particular method and may be selected from a variety of methods.

Here, the insulating layer 4020 is formed to have a stacked structure as the protective film. Here, a silicon oxide film is formed by a sputtering method as a first layer of the insulating layer 4020. The use of a silicon oxide film for the protective film provides an advantageous effect of preventing hillock of an aluminum film used for a source electrode layer and a drain electrode layer.

Moreover, an insulating layer is formed as a second layer of the protective film. Here, a silicon nitride film is formed by a sputtering method as a second layer of the insulating layer 4020. When a silicon nitride film is used for the protective film, it is possible to prevent movable ions such as sodium from entering a semiconductor region to vary the electrical characteristics of the TFT.

Further, after the protective film is formed, the IGZO semiconductor layer may be annealed (at 300° C. to 400° C.).

Further, the insulating layer 4021 is formed as the planarizing insulating film. The insulating layer 4021 can be formed from an organic material having heat resistance, such as polyimide, acrylic, benzocyclobutene, polyamide, or epoxy. As an alternative to such organic materials, it is possible to use a low-dielectric constant material (a low-k material), a siloxane-based resin, PSG (phosphosilicate glass), BPSG (borophosphosilicate glass), or the like. A siloxane-based resin may include as a substituent at least one of fluorine, an alkyl group, and an aryl group, as well as hydrogen. Note that the insulating layer 4021 may be formed by stacking a plurality of insulating films formed of these materials.

Note that a siloxane-based resin is a resin formed from a siloxane-based material as a starting material and having the bond of Si—O—Si. The siloxane-based resin may include as a substituent at least one of fluorine, an alkyl group, and aromatic hydrocarbon, as well as hydrogen.

The method for the formation of the insulating layer 4021 is not limited to a particular method and the following method can be used depending on the material of the insulating layer 4021: a sputtering method, an SOG method, spin coating, dip coating, spray coating, a droplet discharge method (e.g., an inkjet method, screen printing, or offset printing), a doctor knife, a roll coater, a curtain coater, a knife coater, or the like. In the case of forming the insulating layer 4021 with use of a material liquid, annealing (300° C. to 400° C.) may be performed on the IGZO semiconductor layer at the same time as a baking step. When the baking of the insulating layer 4021 and the annealing of the IGZO semiconductor layer are performed at the same time, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed of the conductive composition has preferably a sheet resistance of 10000 Ω/square or less and a transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. As examples thereof, polyaniline or a derivative thereof, polypyrrole or a derivative thereof, polythiophene or a derivative thereof, a copolymer of two or more kinds of them, and the like can be given.

Further, a variety of signals and potentials are supplied from an FPC 4018 to the signal line driver circuit 4003 which is formed separately, the scan line driver circuit 4004, and the pixel portion 4002.

In Embodiment 6, a connecting terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connecting terminal electrode 4015 is electrically connected to a terminal of the FPC 4018 through an anisotropic conductive film 4019.

Although FIGS. 17A and 17B illustrate an example in which the signal line driver circuit 4003 is formed separately and mounted on the first substrate 4001, Embodiment 6 is not limited to this structure. The scan line driver circuit may be separately formed and then mounted, or only part of the signal line driver circuit or part of the scan line driver circuit may be separately formed and then mounted.

Figure 18:
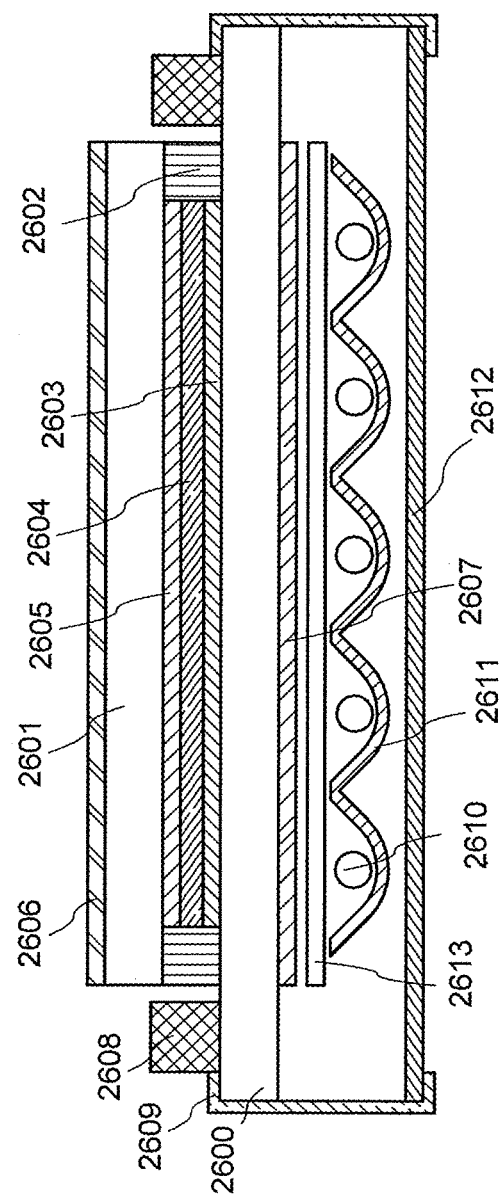
FIG. 18 is a cross-sectional view illustrating a semiconductor device of Embodiment 6.

FIG. 18 illustrates an example in which a liquid crystal display module is formed as a semiconductor device using a TFT substrate 2600 manufactured according to one embodiment of the present invention.

FIG. 18 illustrates an example of a liquid crystal display module, in which the TFT substrate 2600 and a counter substrate 2601 are fixed to each other with a sealing material 2602, and a pixel portion 2603 including a TFT and the like, a display element 2604 including a liquid crystal layer, and a color layer 2605 are provided between the substrates to form a display region. The color layer 2605 is necessary to perform color display. In the case of the RGB system, respective color layers corresponding to colors of red, green, and blue are provided for respective pixels. Polarizing plates 2606 and 2607 and a diffuser plate 2613 are provided outside the TFT substrate 2600 and the counter substrate 2601. A light source includes a cold cathode tube 2610 and a reflective plate 2611, and a circuit board 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation plate therebetween.

For the liquid crystal display module, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Microcell) mode, an OCB (Optically Compensated Birefringence) mode, an FLC (Ferroelectric Liquid Crystal) mode, an AFLC (AntiFerroelectric Liquid Crystal) mode or the like can be used.

Through the above steps, in the connection structure between the first oxide semiconductor layer of the non-linear element and the wiring layers, the provision of the region which is bonded with the second oxide semiconductor layer, which has higher electrical conductivity than the first oxide semiconductor layer, allows stable operation as compared with a case of using only metal wirings. Accordingly, the function of the protective circuit can be enhanced and the operation can be made stable. In addition, it is possible to manufacture a highly-reliable liquid crystal display panel having stable operation, by including a protective circuit including a non-linear element in which defects due to the peeling of the thin films are not easily caused.

Embodiment 6 can be implemented in combination with any structure of the other embodiments as appropriate.

Embodiment 7

A thin film transistor is formed together with a non-linear element according to one embodiment of the present invention, and a semiconductor device having a display function (also referred to as a display device) can be manufactured by using the thin film transistor in a pixel portion and a driver circuit.

Embodiment 7 describes an example of a light-emitting display device as a display device according to one embodiment of the present invention. As an example of a display element of the display device, here, a light-emitting element utilizing electroluminescence is used. Light-emitting elements utilizing electroluminescence are classified according to whether a light emitting material is an organic compound or an inorganic compound. In general, the former is referred to as an organic EL element, the latter as an inorganic EL element.

In an organic EL element, by application of voltage to a light-emitting element, electrons and holes are separately injected from a pair of electrodes into a layer containing a light-emitting organic compound, and thus current flows. Then, those carriers (i.e., electrons and holes) are recombined, and thus, the light-emitting organic compound is excited. When the light-emitting organic compound returns to a ground state from the excited state, light is emitted. Owing to such a mechanism, such a light emitting element is referred to as a current-excitation light emitting element.

The inorganic EL elements are classified, according to their element structures, into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that an organic EL element is used as a light-emitting element here.

Figure 19:
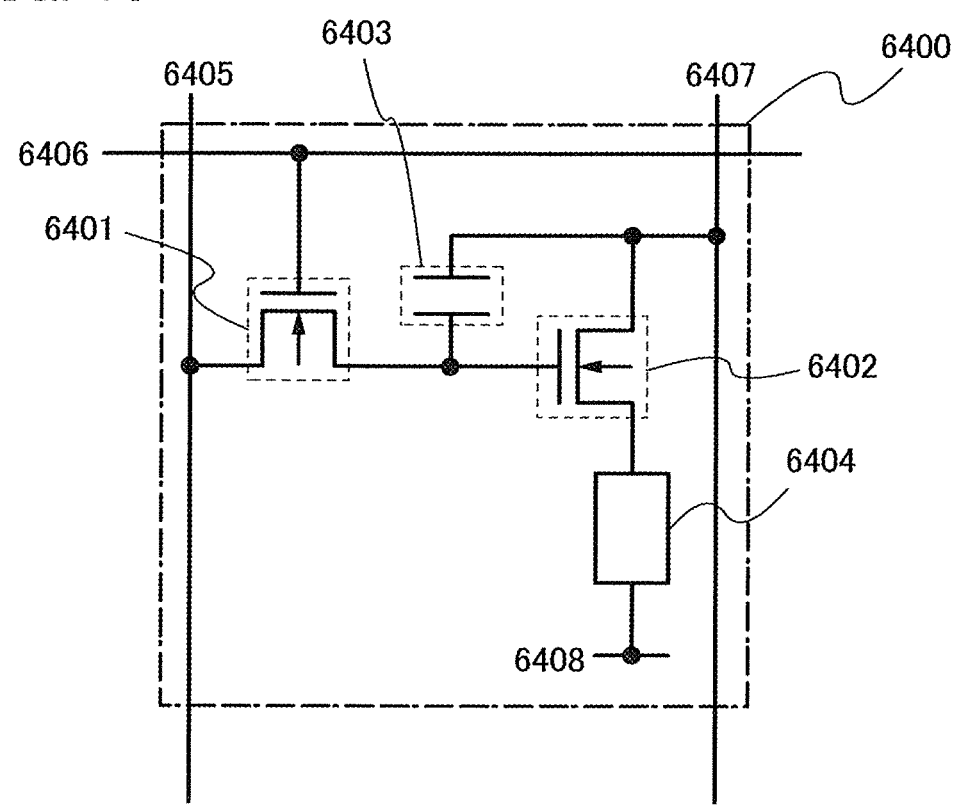
FIG. 19 illustrates an equivalent circuit of a pixel in a semiconductor device of Embodiment 7.

FIG. 19 illustrates an example of a pixel structure to which digital time grayscale driving can be applied, as an example of a semiconductor device according to one embodiment of the present invention.

A structure and operation of a pixel to which digital time grayscale driving can be applied are described. In Embodiment 7, one pixel includes two n-channel transistors in each of which a channel formation region includes an IGZO semiconductor layer and which can be formed together with a non-linear element by a method similar to the method for manufacturing the non-linear element described in Embodiment 2.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408.

The second electrode (common electrode 6408) of the light-emitting element 6404 is set to a low power supply potential. The low power supply potential is a potential satisfying the low power supply potential<a high power supply potential when the high power supply potential set to the power supply line 6407 is a reference. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is greater than or equal to forward threshold voltage.

Gate capacitor of the driving transistor 6402 may be used as a substitute for the capacitor 6403, so that the capacitor 6403 can be omitted. The gate capacitor of the driving transistor 6402 may be formed between the channel formation region and the gate electrode.

In the case of a voltage-input voltage driving method, a video signal is input to the gate of the driving transistor 6402 so that the driving transistor 6402 is in either of two states of being sufficiently turned on and turned off. That is, the driving transistor 6402 operates in a linear region. Since the driving transistor 6402 operates in a linear region, a voltage higher than the voltage of the power supply line 6407 is applied to the gate of the driving transistor 6402. Note that a voltage higher than or equal to (voltage of the power supply line+Vth of the driving transistor 6402) is applied to the signal line 6405.

In a case of performing analog grayscale driving instead of digital time grayscale driving, the same pixel structure as that in FIG. 19 can be used by changing signal input.

In the case of performing analog grayscale driving, a voltage higher than or equal to (forward voltage of the light-emitting element 6404+Vth of the driving transistor 6402) is applied to the gate of the driving transistor 6402. The forward voltage of the light-emitting element 6404 indicates a voltage at which a desired luminance is obtained, and includes at least forward threshold voltage. The video signal by which the driving transistor 6402 operates in a saturation region is input, so that current can be supplied to the light-emitting element 6404. In order for the driving transistor 6402 to operate in a saturation region, the potential of the power supply line 6407 is set higher than the gate potential of the driving transistor 6402. When an analog video signal is used, it is possible to feed current to the light-emitting element 6404 in accordance with the video signal and perform analog grayscale driving.

The pixel structure illustrated in FIG. 19 is not limited thereto. For example, a switch, a resistor, a capacitor, a transistor, a logic circuit, or the like may be added to the pixel illustrated in FIG. 19.

Figure 20A:
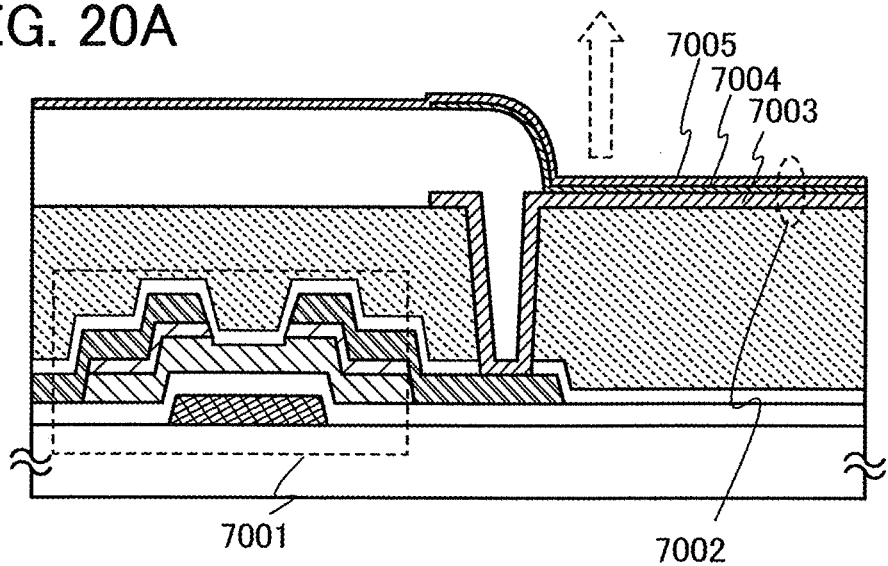
FIGS. 20A to 20C each illustrate a semiconductor device of Embodiment 7.
Figure 20B:
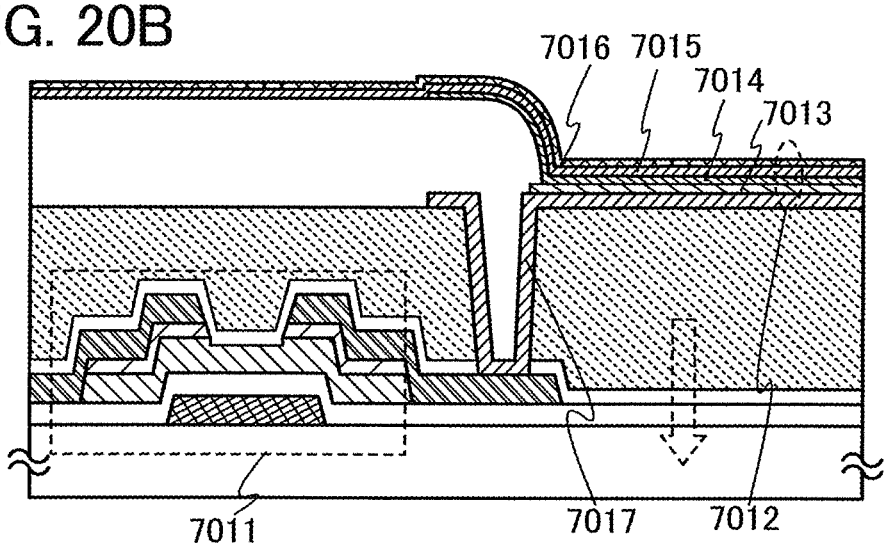
Figure 20C:
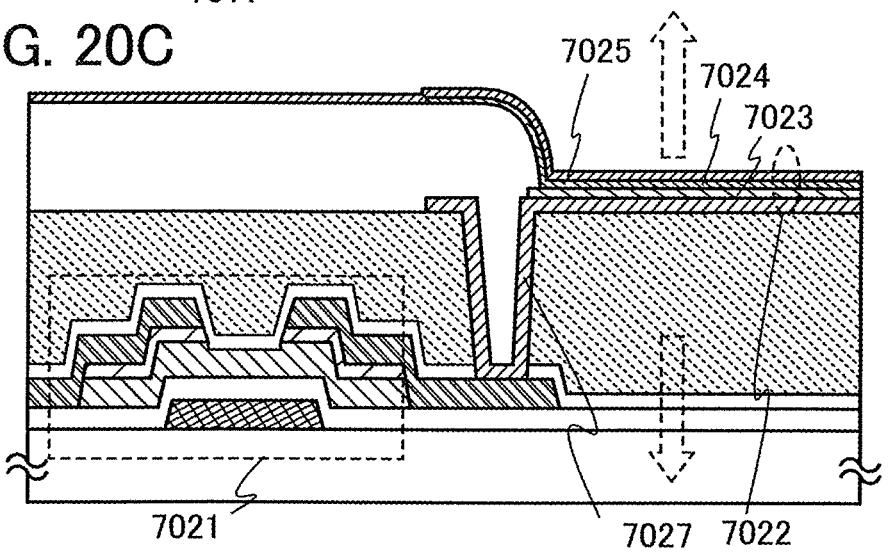

Next, structures of a light-emitting element are described with reference to FIGS. 20A to 20C. A cross-sectional structure of a pixel is described here by taking an n-channel driving TFT as an example. TFTs 7001, 7011, and 7021 serving as driving TFTs used for a semiconductor device, which are illustrated in FIGS. 20A, 20B, and 20C, can be formed together with a non-linear element by a method similar to the method for manufacturing the non-linear element described in Embodiment 2. The TFTs 7001, 7011, and 7021 have high electrical characteristics, in which an oxide semiconductor including In, Ga and Zn is used for a semiconductor layer and a source region and a drain region.

In addition, in order to extract light emitted from the light-emitting element, at least one of an anode and a cathode should be transparent to transmit light. A thin film transistor and a light-emitting element are formed over a substrate. A light-emitting element can have a top-emission structure in which light emission is extracted through the surface opposite to the substrate; a bottom-emission structure in which light emission is extracted through the surface on the substrate side; or a dual-emission structure in which light emission is extracted through the surface opposite to the substrate and the surface on the substrate side. The pixel structure according to one embodiment of the present invention can be applied to a light-emitting element having any of these emission structures.

A light-emitting element with a top-emission structure is described with reference to FIG. 20A.

FIG. 20A is a cross-sectional view of a pixel in a case where the TFT 7001 serving as a driving TFT is an n-channel TFT and light generated in a light-emitting element 7002 is emitted to an anode 7005 side. In FIG. 20A, a cathode 7003 of the light-emitting element 7002 is electrically connected to the TFT 7001 serving as a driving TFT, and a light-emitting layer 7004 and the anode 7005 are stacked in this order over the cathode 7003. The cathode 7003 can be formed using any of a variety of conductive materials as long as it has a low work function and reflects light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 20A, light is emitted from the light-emitting element 7002 to the anode 7005 side as indicated by the arrow of FIG. 20A.

Next, a light-emitting element having the bottom-emission structure is described with reference to FIG. 20B. FIG. 20B is a cross-sectional view of a pixel in the case where a driving TFT 7011 is n-channel, and light is emitted from a light-emitting element 7012 to the cathode 7013 side. In FIG. 20B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property. For the cathode 7013, a variety of materials can be used as in the case of FIG. 20A as long as the cathode 7013 is a conductive film having a low work function. Note that the cathode 7013 is formed to have a thickness that can transmit light (preferably, approximately from 5 nm to 30 nm). For example, an aluminum film with a thickness of 20 nm can be used as the cathode 7013. The light-emitting layer 7014 may be formed of a single layer or by stacking a plurality of layers as in the case of FIG. 20A. The anode 7015 is not required to transmit light, but can be formed using a light-transmitting conductive material as in the case of FIG. 20A. For the light-blocking film 7016, metal or the like that reflects light can be used; however, it is not limited to a metal film. For example, a resin or the like to which black pigment is added can be used.

The light-emitting element 7012 corresponds to a region where the cathode 7013 and the anode 7015 sandwich the light-emitting layer 7014. In the case of the pixel illustrated in FIG. 20B, light is emitted from the light-emitting element 7012 to the cathode 7013 side as indicated by the arrow of FIG. 20B.

Next, a light-emitting element having a dual-emission structure is described with reference to FIG. 20C. In FIG. 20C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 20A, the cathode 7023 can be formed of any of a variety of conductive materials as long as it is conductive and has low work function. Note that the cathode 7023 is formed to have such a thickness that can transmit light. For example, an Al film having a thickness of 20 nm can be used as the cathode 7023. The light-emitting layer 7024 may be formed using a single layer or by stacking a plurality of layers as in the case of FIG. 20A. In a manner similar to FIG. 20A, the anode 7025 can be formed using a light-transmitting conductive material.

The light-emitting element 7022 corresponds to a region where the cathode 7023, the light-emitting layer 7024, and the anode 7025 overlap with each other. In the pixel illustrated in FIG. 20C, light is emitted from the light-emitting element 7022 to both the anode 7025 side and the cathode 7023 side as indicated by the arrows FIG. 20C.

Although an organic EL element is described here as a light-emitting element, an inorganic EL element can be alternatively provided as a light-emitting element.

Note that Embodiment 7 describes the example in which a thin film transistor (driving TFT) which controls the driving of a light-emitting element is electrically connected to the light-emitting element, but a structure may be employed in which a current control TFT is connected between the driving TFT and the light-emitting element.

The semiconductor device described in Embodiment 7 is not limited to the structures illustrated in FIGS. 20A to 20C, and can be modified in various ways based on the spirit of techniques according to the present invention.

Figure 21A:
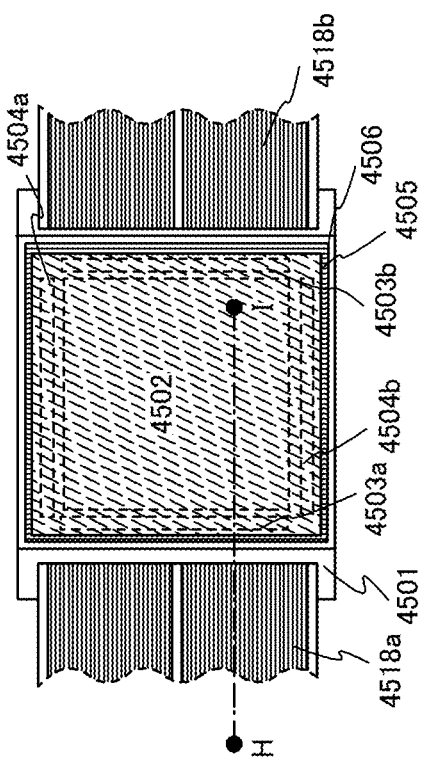
FIG. 21A is a top view and FIG. 21B is a cross-sectional view, both describing a semiconductor device of Embodiment 7.

Next, the appearance and cross section of a light-emitting display panel (also referred to as a light-emitting panel) which corresponds to one mode of a semiconductor device according to the present invention will be described with reference to FIGS. 21A and 21B. FIG. 21A is a top view of a panel in which a light-emitting element and a thin film transistor having high electrical characteristics, in which an oxide semiconductor including In, Ga and Zn is used for its semiconductor layer and its source and drain regions, formed together with a non-linear element by a method similar to the method for manufacturing a non-linear element according to one embodiment of the present invention are sealed between the first substrate and a second substrate with a sealing material, and FIG. 21B is a cross-sectional view along H-I of FIG. 21A.

A sealing material 4505 is provided so as to surround a pixel portion 4502, signal line driver circuits 4503*a* and 4503*b*, and scan line driver circuits 4504*a* and 4504*b*, which are provided over a first substrate 4501. In addition, a second substrate 4506 is formed over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed, together with filler 4507, with the first substrate 4501, the sealing material 4505, and the second substrate 4506. In this manner, packaging (sealing) using a protective film (such as an attachment film or an ultraviolet curable resin film) or a cover material with high air-tightness and little degasification is preferably conducted so that the pixel portion 4502, the signal line driver circuits 4503*a* and 4503*b*, and the scan line driver circuits 4504*a* and 4504*b* are not exposed to external air.

Figure 21B:
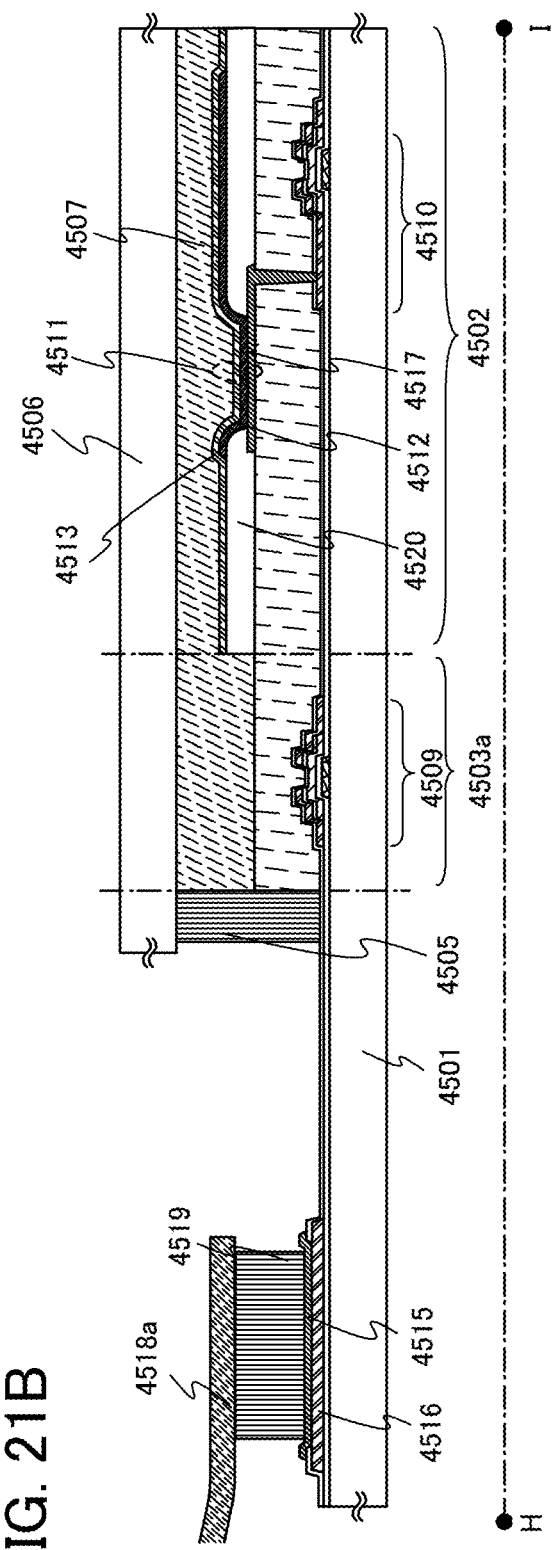

The pixel portion 4502, the signal line driver circuits 4503*a* and 4503*b*, and the scan line driver circuits 4504*a* and 4504*b* formed over the first substrate 4501 each include a plurality of thin film transistors, and the thin film transistor 4510 included in the pixel portion 4502 and the thin film transistor 4509 included in the signal line driver circuit 4503*a* are illustrated as an example in FIG. 21B.

Each of the thin film transistors 4509 and 4510 has has high electrical characteristics, in which an oxide semiconductor including In, Ga and Zn is used for its semiconductor layer and its source and drain regions, and can be manufactured together with a non-linear element in a manner similar to the method for manufacturing the non-linear element described in Embodiment 2. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to source and drain electrode layers of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited to the structure described in Embodiment 7. The structure of the light-emitting element 4511 can be changed as appropriate depending on a direction in which light is extracted from the light-emitting element 4511, or the like.

A partition 4520 is formed using an organic resin film, an inorganic insulating film, or organic polysiloxane. Particularly preferably, the partition 4520 is formed using a photosensitive material and an opening be formed over the first electrode layer 4517 so that a sidewall of the opening is formed as an inclined surface with continuous curvature.

The electroluminescent layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition 4520. As the protective film, a silicon nitride film, a silicon nitride oxide film, a DLC (diamond like carbon) film, or the like can be formed.

In addition, a variety of signals and potentials are supplied from FPCs 4518*a* and 4518*b* to the signal line driver circuits 4503*a* and 4503*b*, the scan line driver circuits 4504*a* and 4504*b*, or the pixel portion 4502.

In Embodiment 7, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connecting terminal electrode 4515 is electrically connected to a terminal included in the FPC 4518*a* through an anisotropic conductive film 4519.

The second substrate 4506 located in the direction in which light is extracted from the light-emitting element 4511 should have a light-transmitting property. In that case, a light-transmitting material such as a glass plate, a plastic plate, a polyester film, or an acrylic film is used.

As the filler 4507, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In Embodiment 7, nitrogen is used for the filler 4507.

In addition, if needed, optical films such as a polarizing plate, a circularly polarizing plate (including an elliptically polarizing plate), a retarder plate (a quarter-wave plate, a half-wave plate), and a color filter may be provided on an emission surface of the light-emitting element, as appropriate. Further, the polarizing plate or the circularly polarizing plate may be provided with an anti-reflection film. For example, anti-glare treatment can be performed by which reflected light is diffused in the depression/projection of the surface and glare can be reduced.

As the signal line driver circuits 4503*a* and 4503*b* and the scan line driver circuits 4504*a* and 4504*b*, driver circuits formed by using a single crystal semiconductor film or polycrystalline semiconductor film over a substrate separately prepared may be mounted. In addition, only the signal line driver circuit or only part thereof, or only the scan line driver circuit or only part thereof may be separately formed to be mounted. Embodiment 7 is not limited to the structure illustrated in FIGS. 21A and 21B.

Through the above steps, in the connection structure between the first oxide semiconductor layer of the non-linear element and the wiring layers, the provision of the region which is bonded with the second oxide semiconductor layer, which has higher electrical conductivity than the first oxide semiconductor layer, or the provision of the region modified by the plasma treatment, allows stable operation as compared with a case of using only metal wirings. Accordingly, the function of the protective circuit is enhanced and the operation can be made stable. Further, it is possible to manufacture a highly-reliable light-emitting display device (display panel) having stable operation, by including a protective circuit including a non-linear element in which defects due to the peeling of the thin films are not easily caused.

Embodiment 7 can be implemented in combination with any structure of the other embodiments as appropriate.

Embodiment 8

A display device according to one embodiment of the present invention can be applied as electronic paper. Electronic paper can be used for electronic devices of every field for displaying information. For example, electronic paper can be used for electronic book (e-book), posters, advertisement in vehicles such as trains, display in a variety of cards such as credit cards, and so on. Examples of such electronic devices are illustrated in FIGS. 22A and 22B and FIG. 23.

Figure 22A:
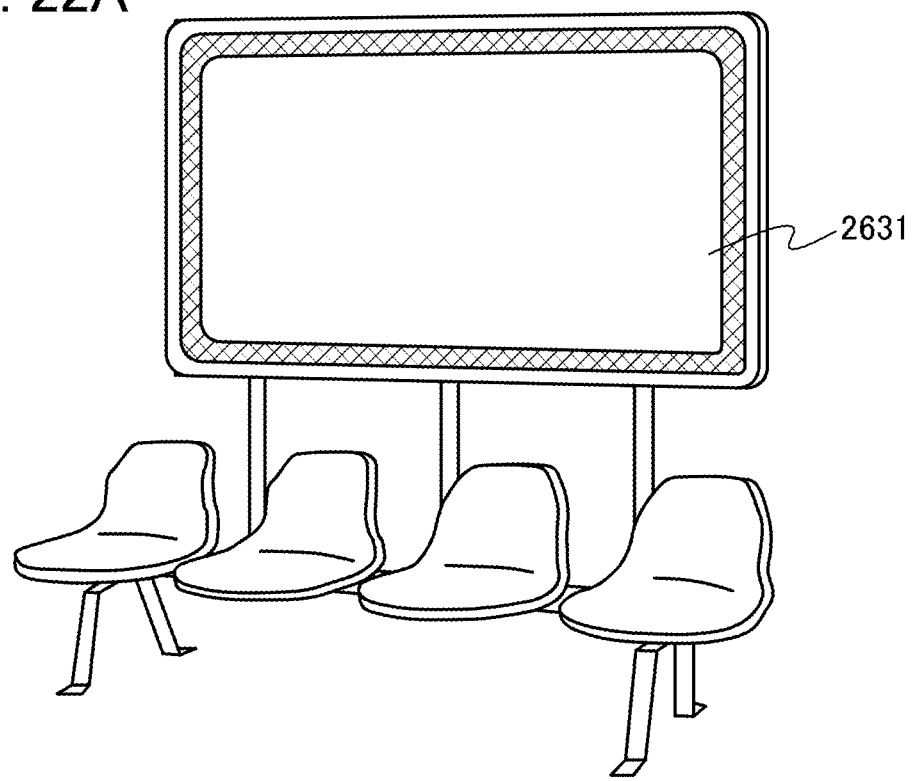
FIGS. 22A and 22B illustrate examples of applications of electronic paper.

FIG. 22A illustrates a poster 2631 formed using electronic paper. If the advertizing medium is printed paper, the advertisement is replaced by manpower, however, when electronic paper according to one embodiment of the present invention is used, the advertisement display can be changed in a short time. Moreover, a stable image can be obtained without display deterioration. Further, the poster may send and receive information wirelessly.

Figure 22B:
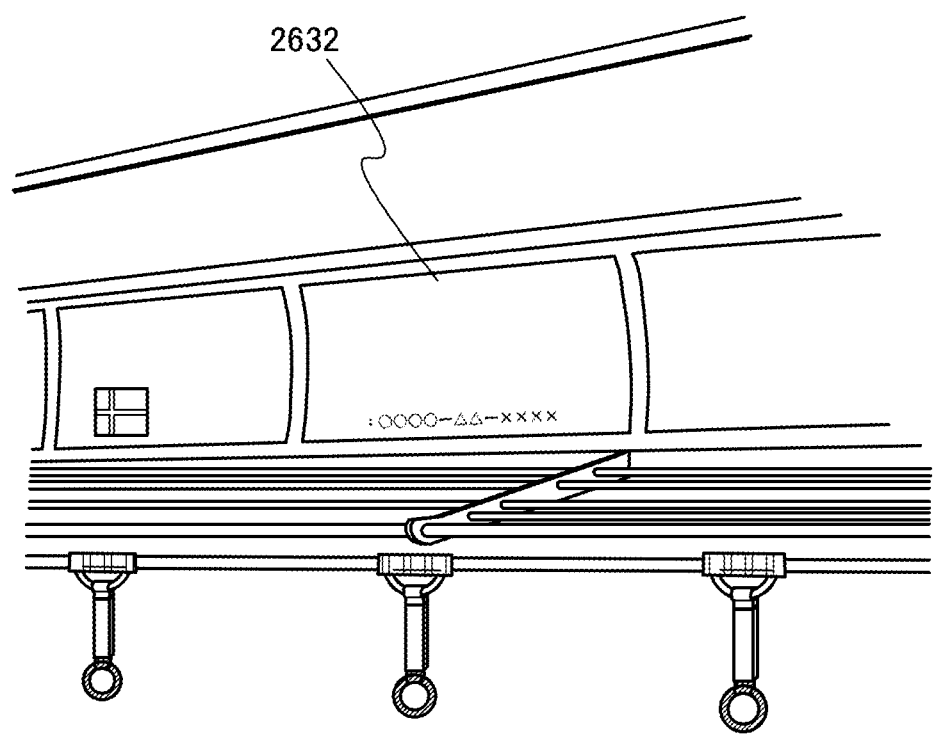

FIG. 22B illustrates an advertisement 2632 in a vehicle such as a train. If the advertizing medium is printed paper, the advertisement is replaced by manpower, however, when electronic paper according to one embodiment of the present invention is used, the advertisement display can be changed in a short time without much manpower. Moreover, a stable image can be obtained without display deterioration. Further, the advertisement in vehicles may send and receive information wirelessly.

Figure 23:
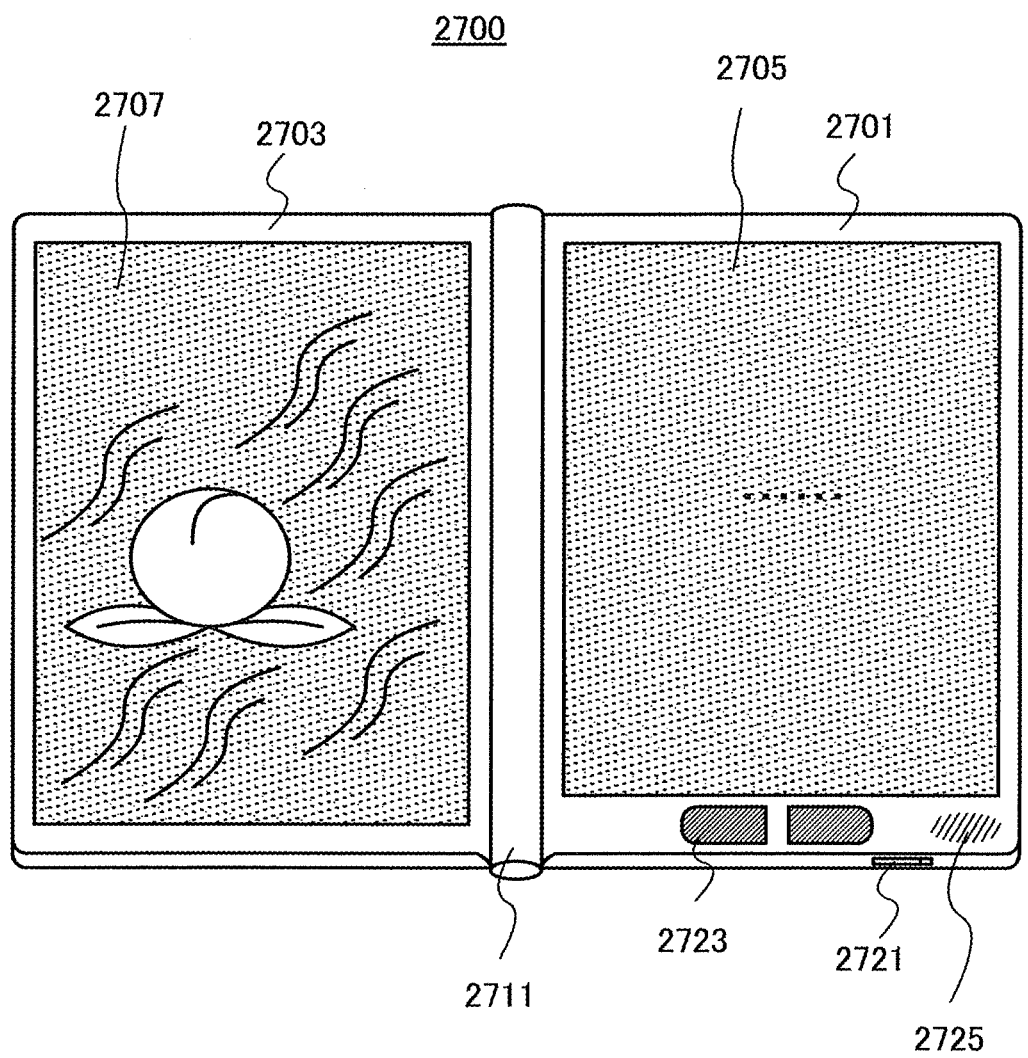
FIG. 23 is an external view illustrating an example of an electronic book device.

FIG. 23 illustrates an example of an electronic book device 2700. For example, the electronic book device 2700 includes two housings 2701 and 2703. The housings 2701 and 2703 are unified with each other by an axis portion 2711, along which the electronic book device 2700 is opened and closed. With such a structure, operation like a paper book is achieved.

A display portion 2705 is incorporated in the housing 2701 and a display portion 2707 is incorporated in the housing 2703. The display portion 2705 and the display portion 2707 may display one image, or may display different images. In the structure where the display portions display different images from each other, for example, the right display portion (the display portion 2705 in FIG. 23) can display text and the left display portion (the display portion 2707 in FIG. 23) can display images.

FIG. 23 illustrates an example in which the housing 2701 is provided with an operation portion and the like. For example, the housing 2701 is provided with a power supply 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adopter or a USB cable, and the like), a storage medium inserting portion, or the like. Moreover, the electronic book device 2700 may have a function of an electronic dictionary.

Further, the electronic book device 2700 may send and receive information wirelessly. Desired book data or the like can be purchased and downloaded from an electronic book server wirelessly.

In the connection structure between the first oxide semiconductor layer of the non-linear element and the wiring layers, the provision of the region which is bonded with the second oxide semiconductor layer, which has higher electrical conductivity than the first oxide semiconductor layer, or the provision of the region modified by the plasma treatment, allows stable operation as compared with a case of using only metal wirings. Accordingly, the function of the protective circuit is enhanced and the operation can be made stable. Further, it is possible to manufacture a highly-reliable electronic paper device having stable operation, by including a protective circuit including a non-linear element in which defects due to the peeling of the thin films are not easily caused.

Embodiment 8 can be implemented in combination with any structure of the other embodiments as appropriate.

Embodiment 9

A semiconductor device according to one embodiment of the present invention can be applied to a variety of electronic devices (including game machines). As the electronic devices, for example, there are a television set (also called TV or a television receiver), a monitor for a computer or the like, a camera such as a digital camera, a digital video camera, a digital photo frame, a mobile phone (also called a mobile phone or a portable telephone device), a portable game machine, a portable information terminal, an audio playback device, and a large game machine such as a pachinko machine.

Figure 24A:
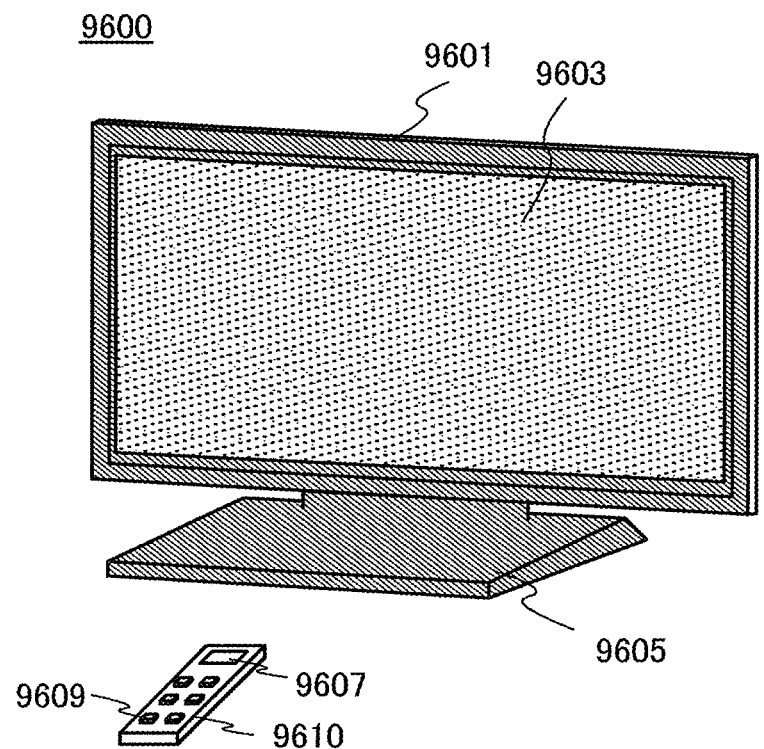
FIG. 24A is an external view of an example of a television set and FIG. 24B is an external view of an example of a digital photo frame.

FIG. 24A illustrates an example of a television set 9600. A display portion 9603 is incorporated in a housing 9601 of the television set 9600. The display portion 9603 can display images. Here, the housing 9601 is supported on a stand 9605.

The television set 9600 can be operated by an operation switch of the housing 9601 or a separate remote controller 9610. The channel and volume can be controlled with operation keys 9609 of the remote controller 9610 and the images displayed in the display portion 9603 can be controlled. Moreover, the remote controller 9610 may have a display portion 9607 in which the information outgoing from the remote controller 9610 is displayed.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 24B:
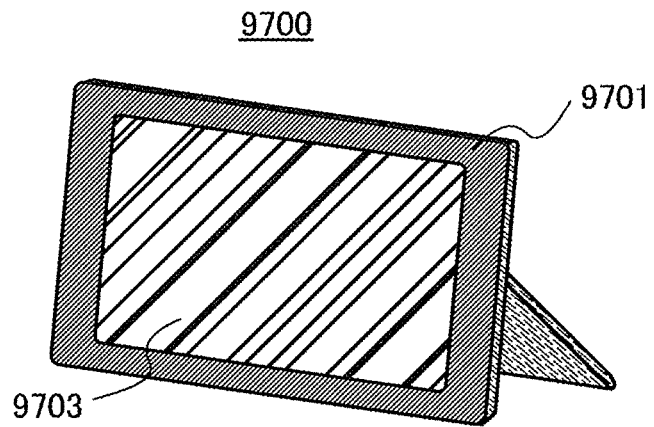

FIG. 24B illustrates an example of a digital photo frame 9700. For example, a display portion 9703 is incorporated in a housing 9701 of the digital photo frame 9700. The display portion 9703 can display a variety of images, for example, displays image data taken with a digital camera or the like, so that the digital photo frame can function in a manner similar to a general picture frame.

Note that the digital photo frame 9700 is provided with an operation portion, an external connection terminal (such as a USB terminal or a terminal which can be connected to a variety of cables including a USB cable), a storage medium inserting portion, and the like. These structures may be incorporated on the same plane as the display portion; however, they are preferably provided on the side surface or rear surface of the display portion because the design is improved. For example, a memory storing data of an image shot by a digital camera is inserted in the recording medium insertion portion of the digital photo frame, whereby the image data can be transferred into the digital photo frame 9700 and displayed on the display portion 9703.

The digital photo frame 9700 may transmit and receive data wirelessly. The structure may be employed in which desired image data is transferred into the digital photo frame 9700 wirelessly to be displayed.

Figure 25A:
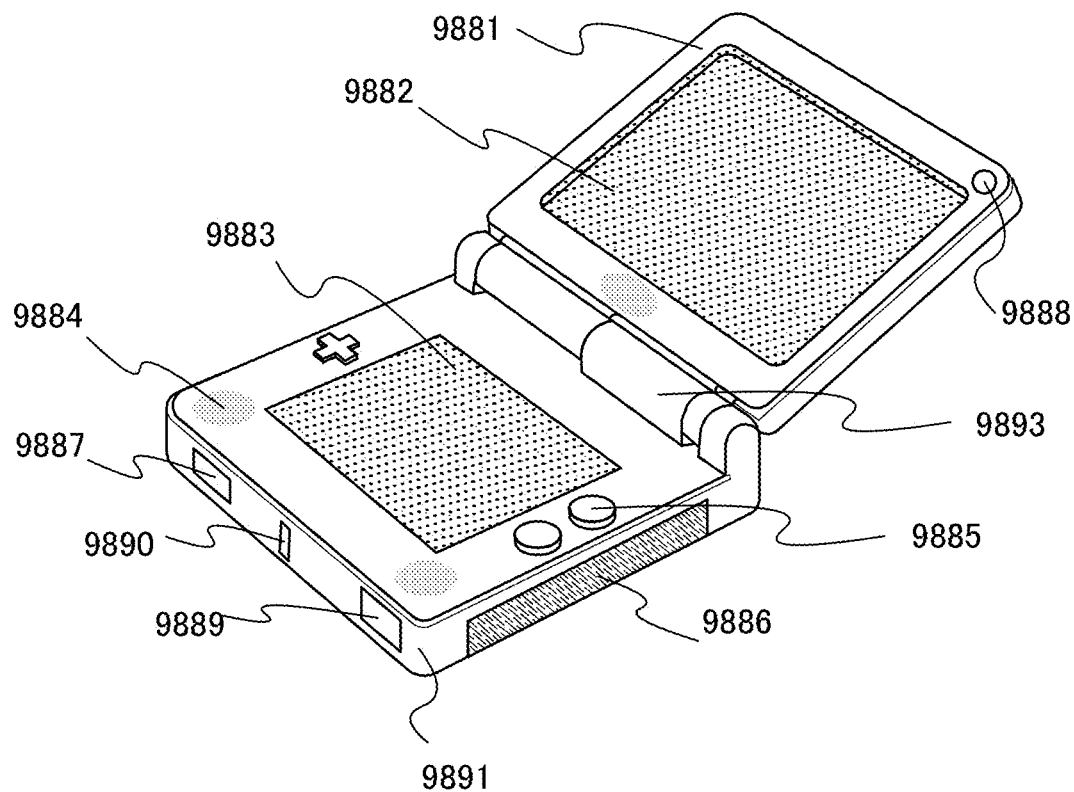
FIGS. 25A and 25B are external views illustrating examples of game machines.

FIG. 25A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 25A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889, and the like). Needless to say, the structure of the portable game machine is not limited to the above, and may be any structure as long as a semiconductor device according to one embodiment of the present invention is provided. Moreover, another accessory may be provided as appropriate. The portable game machine illustrated in FIG. 25A has a function of reading out a program or data stored in a storage medium to display it on the display portion, and a function of sharing information with another portable game machine by wireless communication. The portable game machine in FIG. 25A can have a variety of functions other than those above.

Figure 25B:
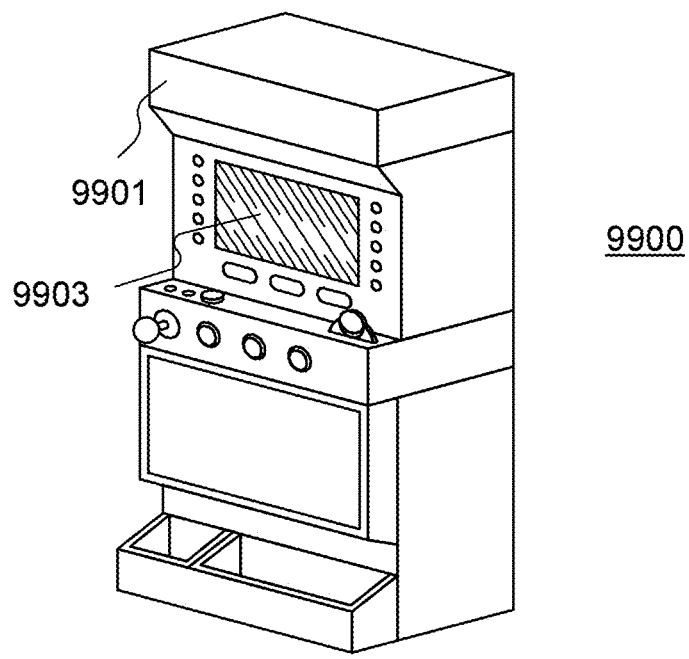

FIG. 25B illustrates an example of a slot machine 9900, which is a large game machine. A display portion 9903 is incorporated in a housing 9901 of the slot machine 9900. The slot machine 9900 additionally includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 26:
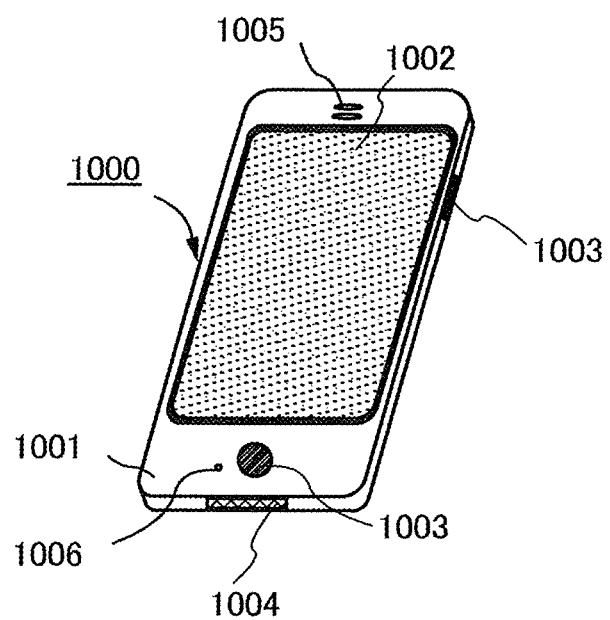
FIG. 26 is an external view illustrating an example of a mobile phone.

FIG. 26 illustrates an example of a mobile phone 1000. The mobile phone 1000 includes a housing 1001 in which a display portion 1002 is incorporated, and moreover includes an operation button 1003, an external connection port 1004, a speaker 1005, a microphone 1006, and the like.

Information can be input to the mobile phone 1000 illustrated in FIG. 26 by touching the display portion 1002 with a finger or the like. Moreover, making a call or text messaging can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a call or text messaging, the display portion 1002 is set to a text input mode where text input is mainly performed, and text input operation can be performed on a screen. In this case, it is preferable to display a keyboard or number buttons on almost the entire screen of the display portion 1002.

When a detection device including a sensor for detecting inclination, such as a gyroscope or an acceleration sensor, is provided inside the mobile phone 1000, display in the screen of the display portion 1002 can be automatically switched by judging the direction of the mobile phone 1000 (whether the mobile phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on kinds of images displayed in the display portion 1002. For example, when a signal for an image displayed in the display portion is data of moving images, the screen mode is switched to the display mode. When the signal is text data, the screen mode is switched to the input mode.

Moreover, in the input mode, when input by touching the display portion 1002 is not performed within a specified period while a signal detected by an optical sensor in the display portion 1002 is detected, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight which emits near-infrared light or a sensing light source which emits near-infrared light is provided in the display portion, an image or data of a finger vein, a palm vein, or the like can be taken.

In the connection structure between the first oxide semiconductor layer of the non-linear element and the wiring layers, the provision of the region which is bonded with the second oxide semiconductor layer, which has higher electrical conductivity than the first oxide semiconductor layer, or the provision of the region modified by the plasma treatment, allows stable operation as compared with a case of using only metal wirings. Accordingly, the function of the protective circuit is enhanced and the operation can be made stable. Further, it is possible to manufacture a highly-reliable electronic device having stable operation, by including a protective circuit including a non-linear element in which defects due to the peeling of the thin films are not easily caused.

Embodiment 9 can be implemented in combination with any structure of the other embodiments as appropriate.

This application is based on Japanese Patent Application serial no. 2008-241645 filed with Japan Patent Office on Sep. 19, 2008, the entire contents of which are hereby incorporated by reference.

What is claimed is:

1. A display device comprising:
a pixel portion;
a protective circuit electrically connected to the pixel portion, the protective circuit comprising a first transistor, a second transistor and a third transistor; and
a first conductive layer, a second conductive layer, a third conductive layer, a fourth conductive layer, a fifth conductive layer, and a sixth conductive layer,
wherein:
the first conductive layer has a first region functioning as one of a source and a drain of the first transistor and a second region functioning as one of a source and a drain of the second transistor;
the second conductive layer has a first region functioning as the other of the source and the drain of the first transistor and a second region functioning as one of a source and a drain of the third transistor;
the second conductive layer is electrically connected to the third conductive layer;
the third conductive layer has a first region functioning as a gate of the first transistor and a second region functioning as a first wiring;
the fourth conductive layer has a first region functioning as the other of the source and the drain of the second transistor, a second region functioning as the other of the source and the drain of the third transistor, and a third region functioning as a second wiring;
the fifth conductive layer has a region functioning as a gate of the second transistor;
the fifth conductive layer is electrically connected to the fourth conductive layer;
the sixth conductive layer has a region functioning as a gate of the third transistor;
the sixth conductive layer is electrically connected to the first conductive layer;
in a plan view, the first wiring is provided so as to extend in a first direction;
in the plan view, the second wiring is provided so as to extend in a second direction intersecting the first direction;
in the plan view, a channel length direction of the first transistor is along the first direction;
in the plan view, a channel length direction of the second transistor is along the first direction; and
in the plan view, a channel length direction of the third transistor is along the second direction.

2. A display device comprising:
a protective circuit;
a pixel portion electrically connected to the protective circuit, the protective circuit comprising a first transistor, a second transistor, and a third transistor; and
a first conductive layer, a second conductive layer, a third conductive layer, a fourth conductive layer, a fifth conductive layer, and a sixth conductive layer,
wherein:
the first conductive layer has a first region functioning as one of a source and a drain of the first transistor and a second region functioning as one of a source and a drain of the second transistor;
the second conductive layer has a first region functioning as the other of the source and the drain of the first transistor and a second region functioning as one of a source and a drain of the third transistor;
the second conductive layer is electrically connected to the third conductive layer;
the third conductive layer has a first region functioning as a gate of the first transistor and a second region functioning as a first wiring;
the fourth conductive layer has a first region functioning as the other of the source and the drain of the second transistor, a second region functioning as the other of the source and the drain of the third transistor, and a third region functioning as a second wiring;
the fifth conductive layer has a region functioning as a gate of the second transistor;
the fifth conductive layer is electrically connected to the fourth conductive layer;
the sixth conductive layer has a region functioning as a gate of the third transistor;
the sixth conductive layer is electrically connected to the first conductive layer;
in a plan view, the first wiring is provided so as to extend in a first direction;
in the plan view, the second wiring is provided so as to extend in a second direction intersecting the first direction;
in the plan view, a direction connecting the one of the source and the drain of the first transistor and the other of the source and the drain of the first transistor is along the first direction;
in the plan view, a direction connecting the one of the source and the drain of the second transistor and the other of the source and the drain of the second transistor is along the first direction; and
in the plan view, a direction connecting the one of the source and the drain of the third transistor and the other of the source and the drain of the third transistor is along the second direction.

3. A display device comprising:
a pixel portion;
a protective circuit electrically connected to the pixel portion, the protective circuit comprising a first transistor, a second transistor and a third transistor; and
a first conductive layer, a second conductive layer, a third conductive layer, a fourth conductive layer, a fifth conductive layer, and a sixth conductive layer,
wherein:
the first conductive layer has a first region functioning as one of a source and a drain of the first transistor and a second region functioning as one of a source and a drain of the second transistor;
the second conductive layer has a first region functioning as the other of the source and the drain of the first transistor and a second region functioning as one of a source and a drain of the third transistor;
the second conductive layer is electrically connected to the third conductive layer;

the third conductive layer has a first region functioning as a gate of the first transistor and a second region functioning as a first wiring;

the fourth conductive layer has a first region functioning as the other of the source and the drain of the second transistor, a second region functioning as the other of the source and the drain of the third transistor, and a third region functioning as a second wiring;

the fifth conductive layer has a region functioning as a gate of the second transistor;

the fifth conductive layer is electrically connected to the fourth conductive layer;

the sixth conductive layer has a region functioning as a gate of the third transistor;

the sixth conductive layer is electrically connected to the first conductive layer;

in a plan view, the first wiring is provided so as to extend in a first direction;

in the plan view, the second wiring is provided so as to extend in a second direction intersecting the first direction;

in the plan view, a channel width direction of the first transistor is along the second direction;

in the plan view, a channel width direction of the second transistor is along the second direction; and in the plan view, a channel width direction of the third transistor is along the first direction.

4. The display device according to claim 1, wherein a channel formation region of the first transistor, a channel formation region of the second transistor, and a channel formation region of the third transistor comprises an oxide semiconductor.

5. The display device according to claim 2, wherein a channel formation region of the first transistor, a channel formation region of the second transistor, and a channel formation region of the third transistor comprises an oxide semiconductor.

6. The display device according to claim 3, wherein a channel formation region of the first transistor, a channel formation region of the second transistor, and a channel formation region of the third transistor comprises an oxide semiconductor.

* * * * *